United States Patent [19]
Thompson et al.

[11] Patent Number: 5,996,241
[45] Date of Patent: Dec. 7, 1999

[54] SEMICONDUCTOR WAFER PROCESSING SYSTEM WITH IMMERSION MODULE

[75] Inventors: Raymon F. Thompson, Lakeside; Robert W. Berner, Kalispell; Gary L. Curtis, Kila; Stephen P. Culliton, Kalispell; Blaine G. Wright, Whitefish, all of Mont.

[73] Assignee: Semitool, Inc., Kalispell, Mont.

[21] Appl. No.: 08/813,860

[22] Filed: Mar. 7, 1997

Related U.S. Application Data

[63] Continuation of application No. 08/623,659, Mar. 29, 1996, Pat. No. 5,788,454, which is a continuation of application No. 08/236,424, Apr. 28, 1994, Pat. No. 5,544,421.

[51] Int. Cl.[6] .................................................. F26B 17/24
[52] U.S. Cl. .............................. 34/58; 414/938; 414/940; 414/217; 414/222; 134/902; 134/102.3
[58] Field of Search ............................... 34/58; 414/217, 414/222, 417, 935, 938, 939, 940, 941; 134/102.2, 102.3, 95.2, 153, 902

[56] References Cited

U.S. PATENT DOCUMENTS

| | | | |
|---|---|---|---|
| 4,431,361 | 2/1984 | Bayne | 414/750 |
| 4,449,885 | 5/1984 | Hertel et al. | 414/404 |
| 4,840,530 | 6/1989 | Nguyen | 414/404 |
| 4,924,890 | 5/1990 | Giles et al. | 134/61 |
| 5,055,036 | 10/1991 | Asano et al. | 432/5 |
| 5,125,784 | 6/1992 | Asano | 414/404 |
| 5,232,328 | 8/1993 | Owczarz et al. | 414/222 |
| 5,301,700 | 4/1994 | Kamikawa et al. | 134/76 |
| 5,544,421 | 8/1996 | Thompson et al. | 415/405 |

FOREIGN PATENT DOCUMENTS

| | | |
|---|---|---|
| 0047132 | 3/1982 | European Pat. Off. . |
| WO81/02533 | 9/1981 | WIPO . |

Primary Examiner—Henry A. Bennett
Assistant Examiner—Pamela A. Wilson
Attorney, Agent, or Firm—Lyon & Lyon LLP

[57] ABSTRACT

A processor for processing integrated circuit wafers, semiconductor substrates, data disks and similar units requiring very low contamination levels. The processor has an interface section which receives wafers in standard wafer carriers. The interface section transfers the wafers from carriers onto novel trays for improved processing. The interface unit can hold multiple groups of multiple trays. A conveyor having an automated arm assembly moves wafers supported on a tray. The conveyor moves the trays from the interface along a track to several processing stations. The processing stations are accessed from an enclosed area adjoining the interface section.

20 Claims, 36 Drawing Sheets

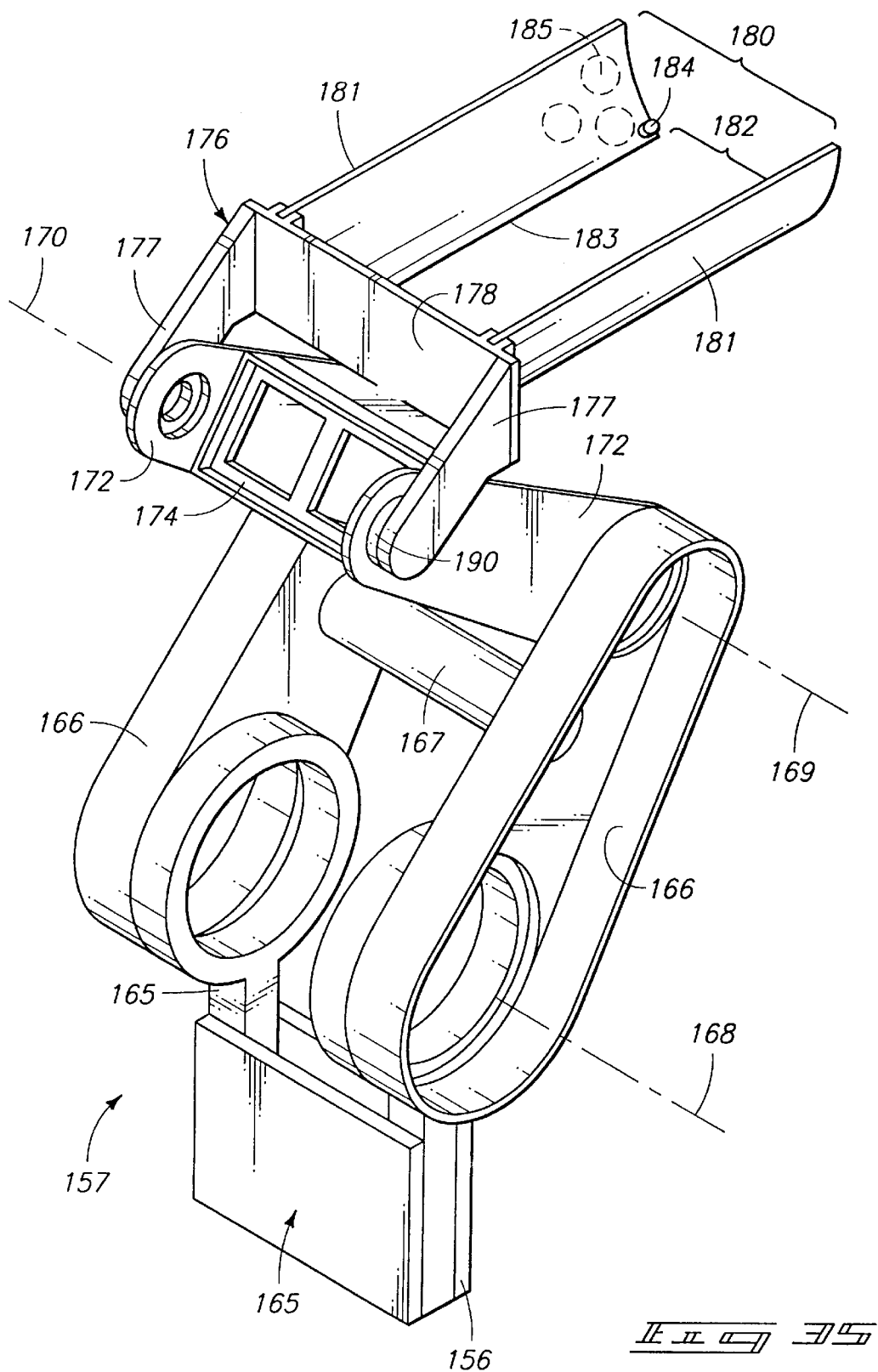

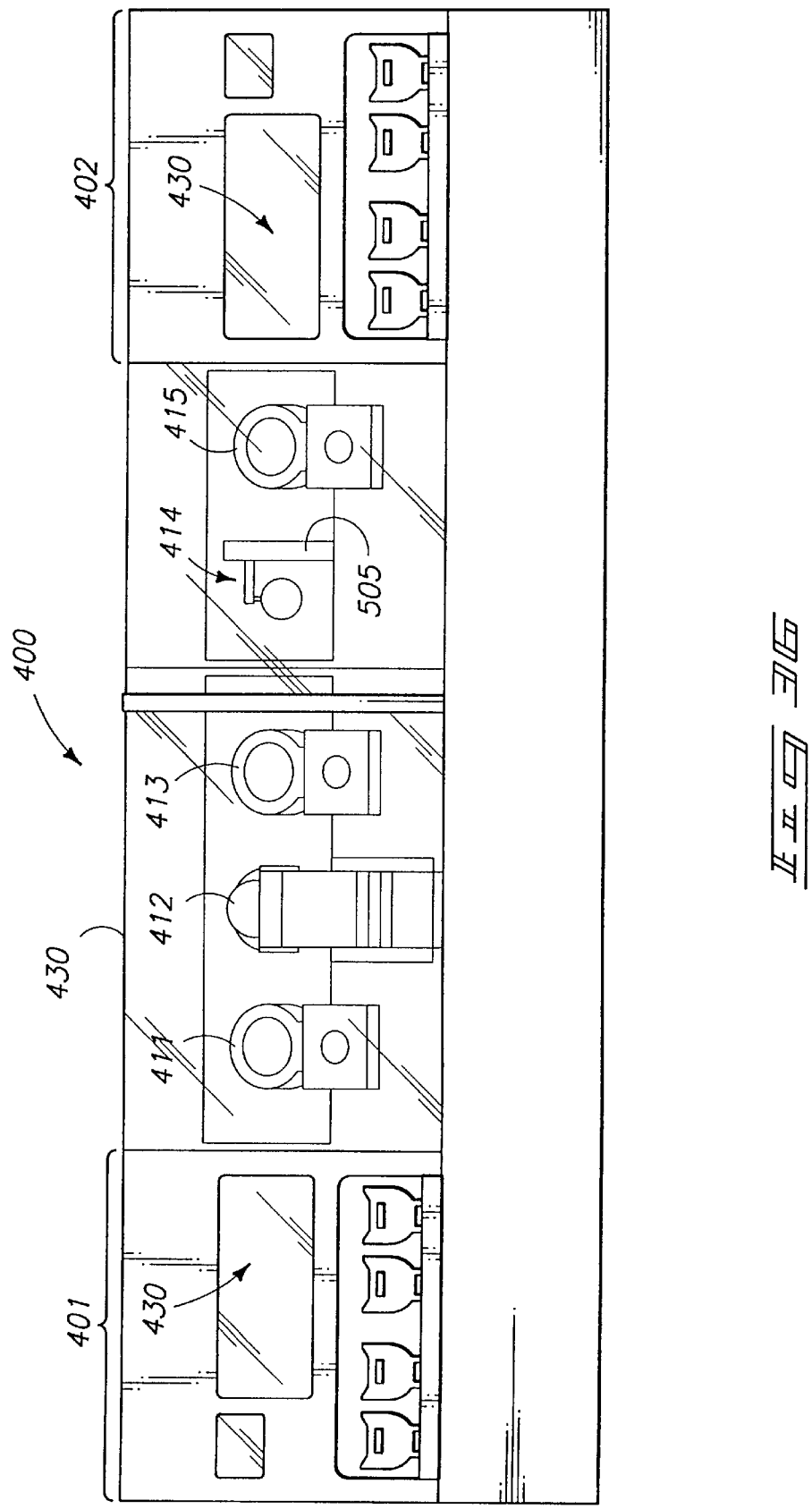

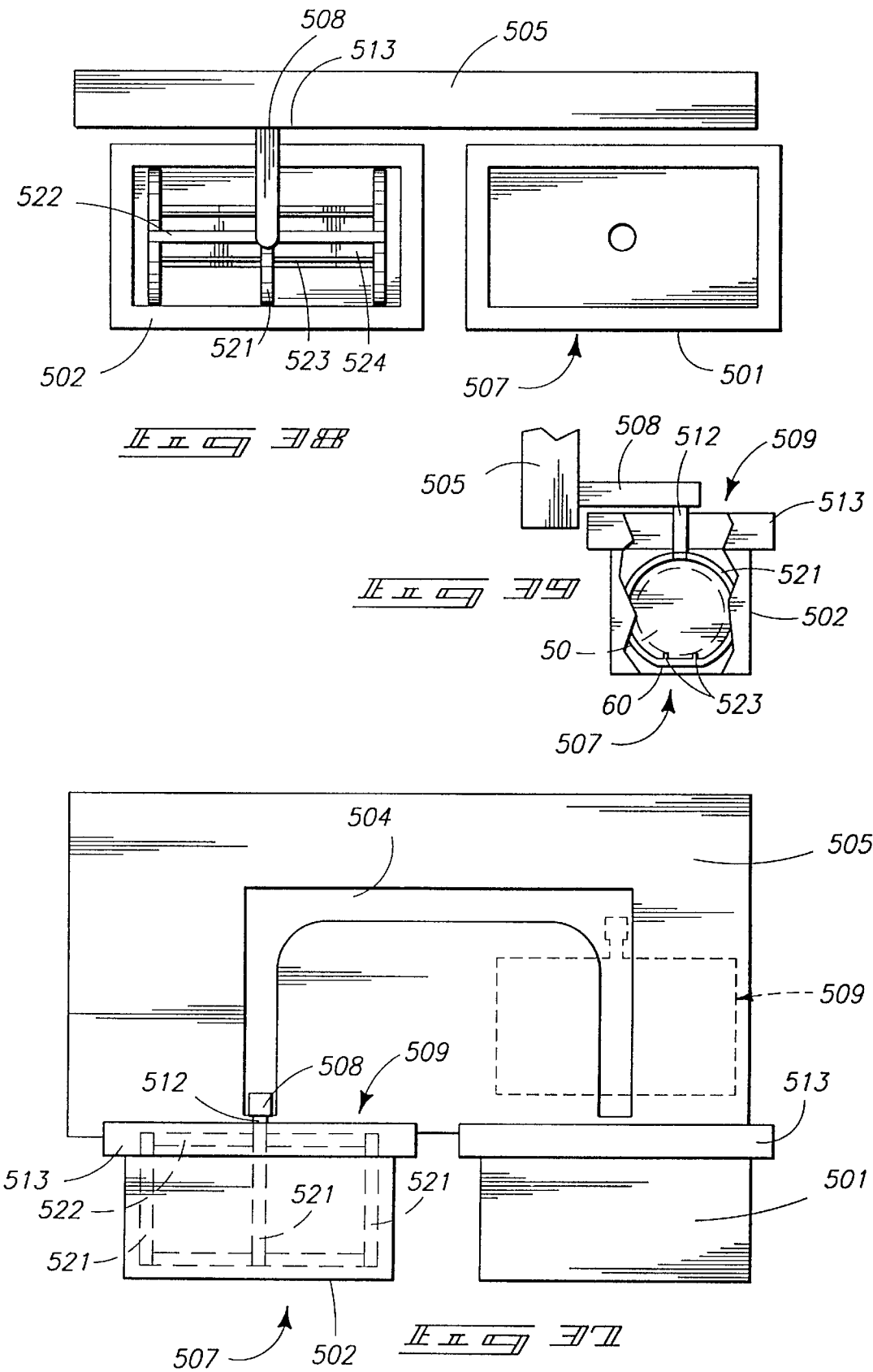

SEMICONDUCTOR WAFER PROCESSING SYSTEM WITH IMMERSION MODULE

CROSS-REFERENCES TO RELATED CASES

This is a continuation of U.S. patent application Ser. No. 08/623,659, filed Mar. 29, 1996 (now U.S. Pat. No. 5,788,454, issued Aug. 4, 1998); which was a continuation of U.S. patent application Ser. No. 08/236,424, filed Apr. 28, 1994 (now U.S. Pat. No. 5,544,421, issued Aug. 13, 1996).

TECHNICAL FIELD

This invention relates to automated semiconductor wafer processing systems for performing liquid and gaseous processing of wafers. Such systems can be used to process semiconductor wafers, data disks, semiconductor substrates and similar articles requiring very low contaminant levels.

BACKGROUND OF THE INVENTION

The processing of semiconductor wafers has become of great economic significance due to the large volume of integrated circuits, data disks, and similar articles being produced.

The size of features used in integrated circuits and data disks have decreased significantly, thus providing greater integration and greater capacity. This has been possible due to improved lithography techniques and improved processing.

The reduction in feature size has been limited by contamination. This is true because various contaminating particles, crystals, metals and organics lead to defects in the resulting products. The limitations on feature size caused by contaminants have prevented full utilization of the resolution capability of known lithography techniques. Thus there remains an acute need for improved methods and systems for processing semiconductor wafers, data disks and similar articles requiring very low levels of contamination during processing.

BRIEF DESCRIPTION OF THE DRAWINGS

Preferred embodiments of the invention are described below with reference to the accompanying drawings, which are briefly described below.

FIG. 35 is a perspective view showing important components of the mechanical arm assembly shown in FIG. 13.

FIG. 36 is a front elevational view of an alternative processor according to this invention.

FIG. 37 is a side elevational view detailing an alternative processing station used in the processor of FIG. 36.

FIG. 38 is a top view detailing the alternative processing station shown in FIG. 37.

FIG. 39 is a rear elevational view detailing the alternative processing station shown in FIG. 37.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Processor Generally

Figure 1:
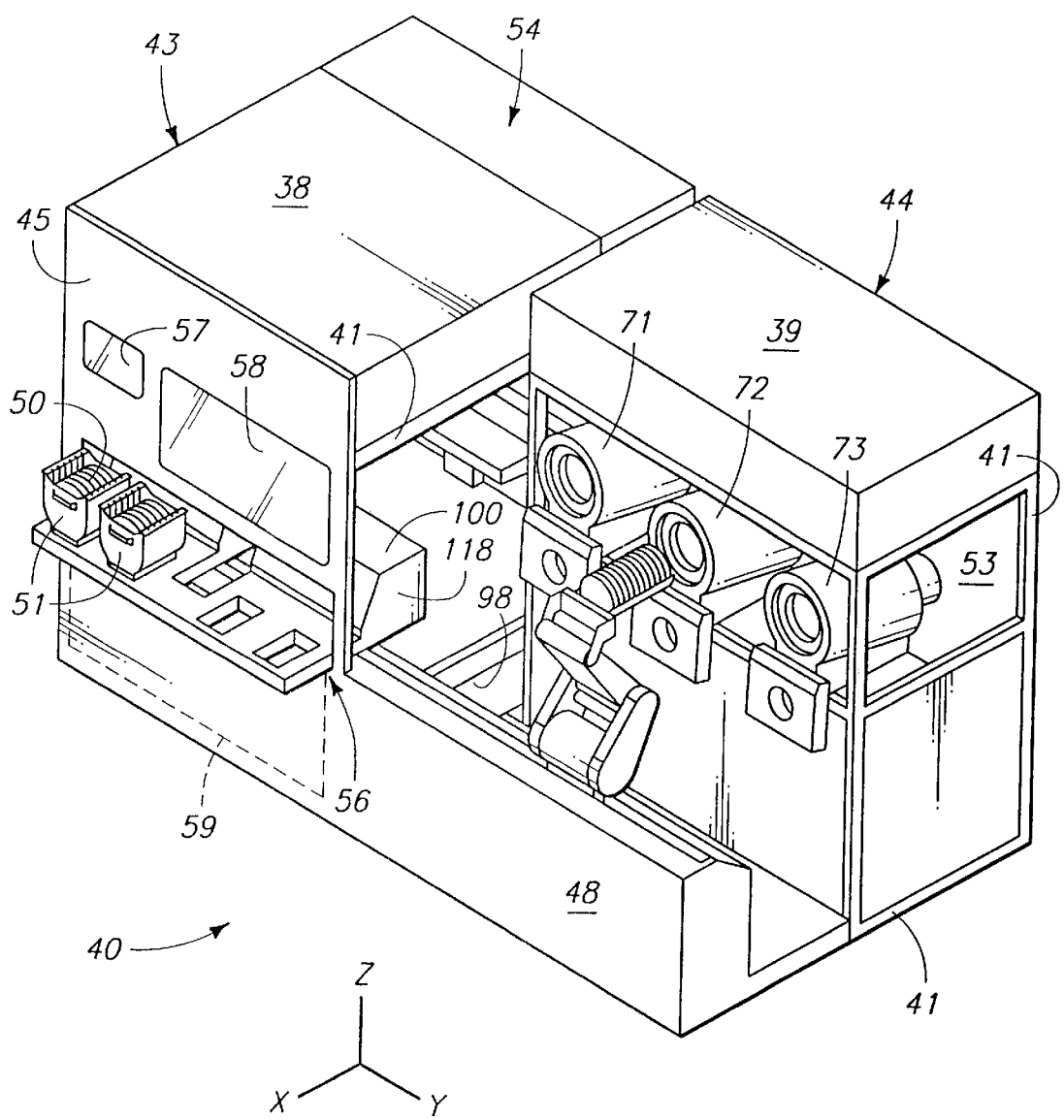
FIG. 1 is a perspective view showing a preferred semiconductor wafer processing system according to this invention.

FIG. 1 shows a preferred processing system 40 according to this invention. Processing system 40 includes a basic frame 41 which provides structural support for related components. Processor 40 has two fundamental sections, one of which is the interface section 43. The other fundamental section is the processing section 44.

The frame supports an enclosure envelope 45 which in FIG. 1 is shown partially removed adjacent the processing section for purposes of illustration. The enclosure envelope encloses a working space 46 within portions of processor 40. Wafers 50 are held and maneuvered within the enclosed working space. The wafers are moved between multiple processing stations 71–73 contained within the processing section 44. The working space can be supplied with a purge gas and operated at either slightly elevated or slightly reduced pressures relative to ambient atmospheric pressure.

The upper portions of processor 40 are provided with an interface filter section 38 and a processing filter section 39. These filter sections preferably employ HEPA type ultrafiltration filters. Air moving equipment forces air through the filters and downwardly into the working space to move contaminants downwardly and out through the back side of the processor.

The multi-station processor 40 also preferably has a process station maintenance section 53 which is separated from the work space 26 by portions of the enclosure envelope 45. Processor 40 also preferably has an instrumentation and control section 54 mounted rearwardly from the interface section 43. Control section 54 preferably includes various control equipment used in processor 40.

Maintenance section 53 and control section 54 are of potentially higher contamination levels due to the presence of various equipment components associated with the processing stations. The processor 40 is advantageously mounted in a wafer fabrication facility with clean room access to the front of the processor along front panel 48. The maintenance and control sections are preferably accessed from the rear of processor 40 through a gray room adjacent the clean room. Such gray rooms have fewer precautions against contamination than the clean room. This configuration reduces plant costs while allowing access to portions of the processor more typically needing maintenance.

The front of processor 40 includes a front control panel 57 allowing operator control from the clean room. Control panel 57 is advantageously a touch screen cathode ray tube control display allowing finger contact to the display screen to effect various control functions. Control section 54 also preferably includes a secondary control panel (shown schematically in FIG. 34) which faces rearwardly into the gray room so that operation can be affected from either front or back of the machine. All control functions and options are displayed upon the control panels to effect operation and set up of the processor.

As shown, wafers 50 are supplied to and removed from the enclosed work space 46 of processor 40 using interface section 43. Wafers are supplied to the interface section in industry standard wafer carriers 51 (detailed in FIG. 5). The wafer carriers are preferably supplied in groups, such as a group of four carriers. The groups are placed upon a cantilevered shelf 101 forming a part of a first carriage 100. Shelf 101 extends through an interface port 56 which is controllably opened and closed using a interface port door 59. Adjacent the interface port and control panel is a view window 58 through which a human operator can see operation of processor 40. FIG. 1 shows two wafer carriers 51 positioned upon the cantilevered shelf 101. There are two additional positions available for two additional carriers which are left unloaded in FIG. 1.

Wafer Tray

Figure 2:
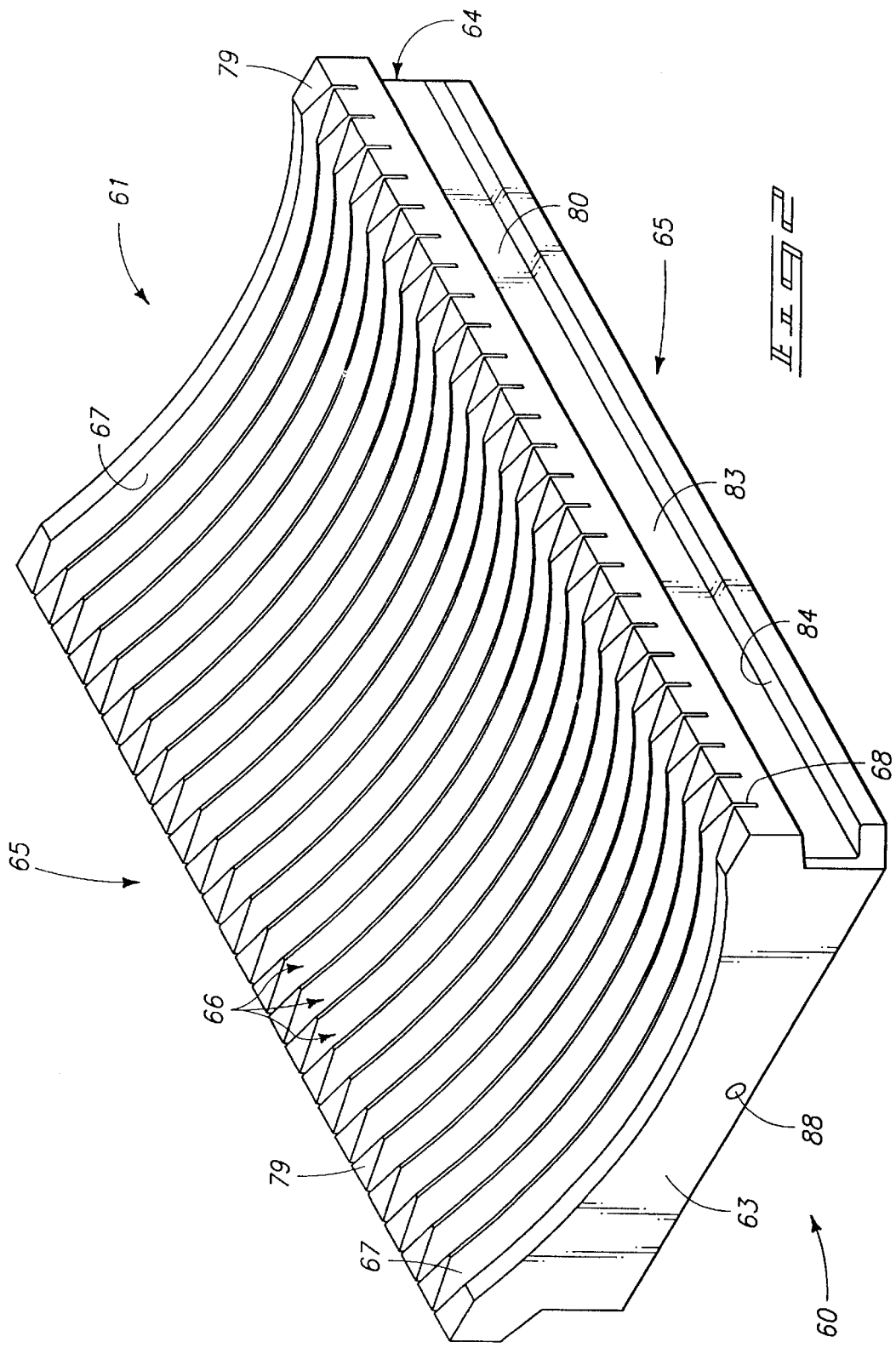
FIG. 2 is a perspective view showing top portions of a wafer holding tray used in the processing system of FIG. 1.
Figure 3:
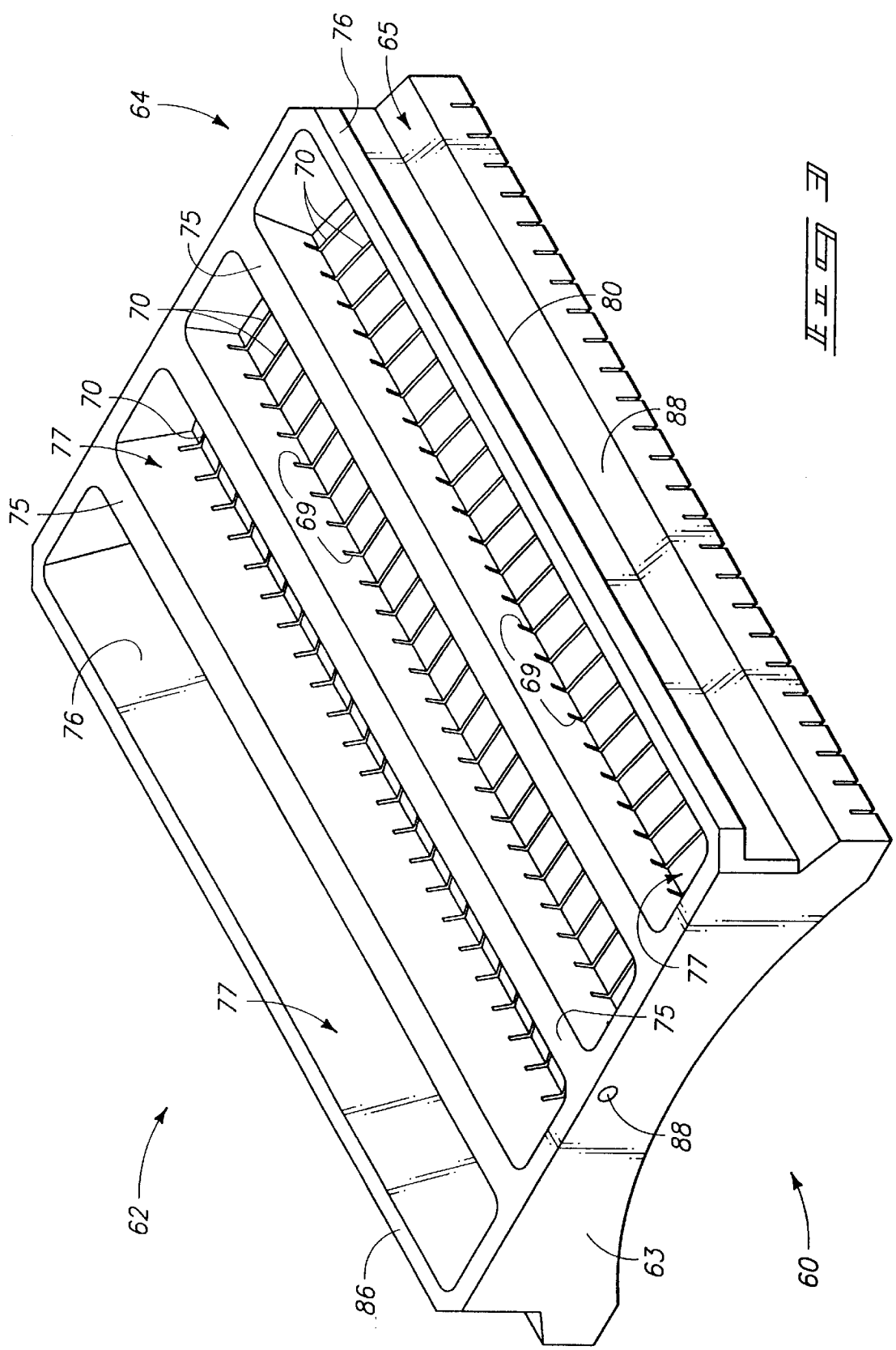
FIG. 3 is a perspective view showing bottom portions of a wafer holding tray used in the processing system of FIG. 1.

Refer to FIGS. 2 and 3 which show the novel wafer tray 60 in greater detail. Wafer tray 60 includes an upper surface 61 and a lower surface 62. The tray also has a first end 63 and a second end 64. Sides 65 extend between the first and second ends. Additional features of the tray surfaces will now be more fully detailed.

Upper surface 61 has a series of wafer tray receivers 66. Wafer tray receivers 66 each comprise a semicircular groove or channel having downwardly converging receiver sides 67. The converging receiver sides 67 adjoin to a receiver bottom section 68 which is a relatively narrow slot having substantially parallel slot walls. The slot section is sized to provide a width about 0–10% greater than the thickness of the wafers which are being received therein. The receiver bottom or slot section has bottom surfaces 69. The lower portions of the slot sections 68 are formed so as to be intermittently closed at slot bottom surfaces 69 and open along receiver drain apertures 70 (FIG. 3). The slot bottom surfaces 69 exist along longitudinal foundation bars 75 and side rail portions 76. The particular number of wafer tray receivers 66 in any particular tray 60 is variable. Typically, there will be 25 or 50 wafer receivers in order to correspond with the capacity of associated wafer carriers 51 being used in other parts of the fabrication plant.

The upper surfaces of wafer tray 60 also preferably include side land portions 79. The side land portions are formed to reduce overall height of the tray while maintaining the general semicircular receiver shape. The overall width of tray 60 is appropriately sized so that more than approximately 50° of arc are seated, more preferably approximately 60–80° of arc are encompassed for seating the wafers in receivers 66. Even more preferably the arc of the receiving channels is approximately 65°.

Figure 4:
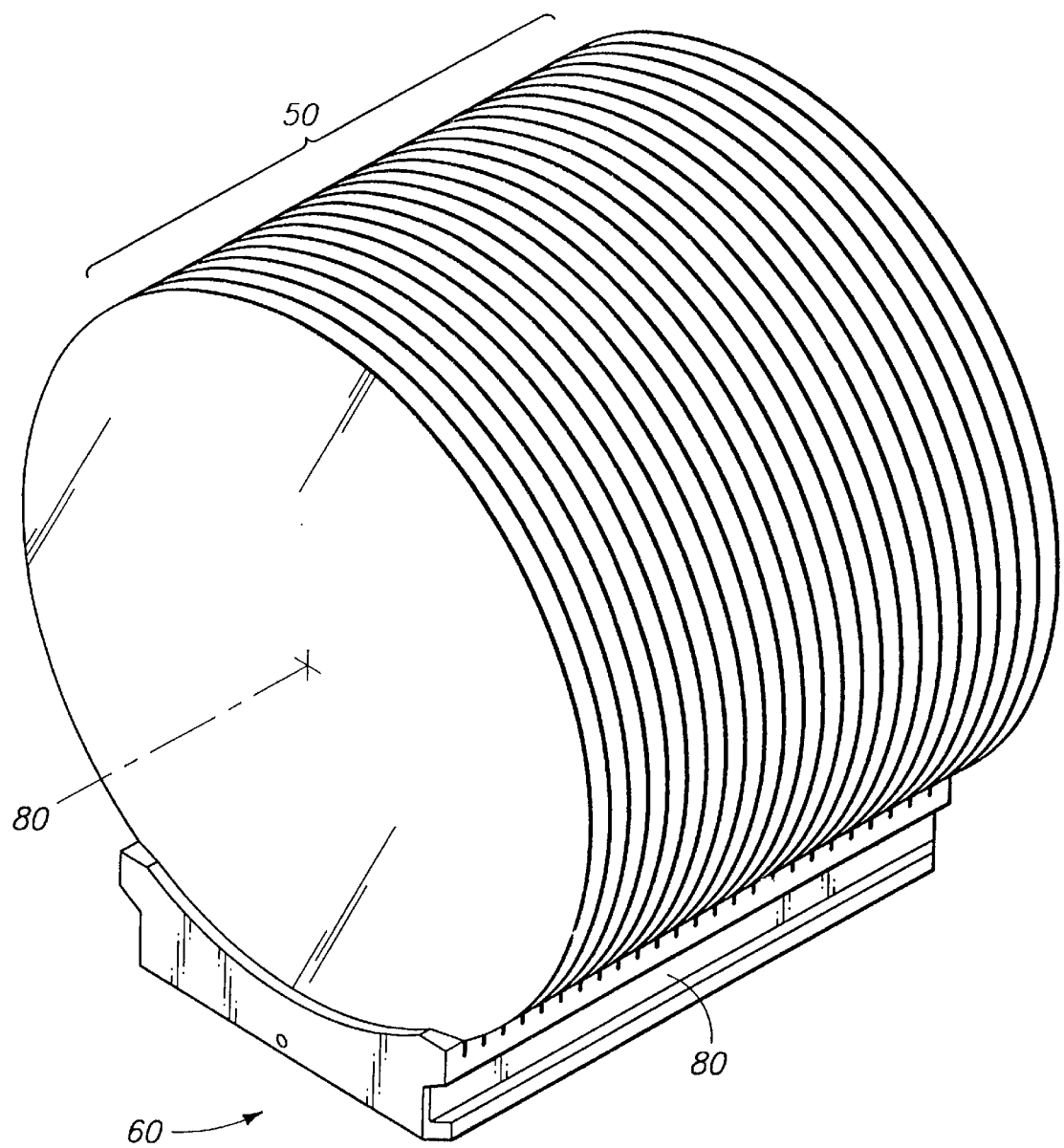
FIG. 4 is a perspective view showing the tray of FIG. 2 loaded with wafers.

The wafer tray ends 63 and 64 are preferably planar and perpendicular relative to a longitudinal axis 80 (FIG. 4) which extends perpendicular to the receiving grooves along the center point of the receiving groove arcs defined by bottom surfaces 69. Longitudinal axis 80 also coincides with the centers of the wafers 50 supported on the wafer tray. Tray ends 63 and 64 are advantageously provided with apertures 88 for receiving a tool therein to allow handling of the trays with minimum contact, such as during cleaning.

Wafer tray 60 has side rails 76 which extend along both sides. The side rails have outer side surfaces 65 which are advantageously formed to provide tray support features 80. As shown, tray support features 80 include a tray side channel 81. Tray side channel 81 has a downward facing bearing surface 82 which bears upon supporting tools and equipment as explained more fully hereinbelow. Adjacent to surface 82, is an outwardly facing channel base surface 83. Bearing surface 82 is preferably constructed to form an included angle of approximately 120° of arc relative to the channel base 83. Channel 81 further includes an upwardly facing third surface 84 which serves to complete the channel shape of the tray support features and provides increased structural engagement between the wafer tray and equipment which engages the tray using the tray side channels 81.

The lower surface 62 of tray 60 is preferably formed with a downwardly facing contact or foot surface 86. As shown, foot surface 86 defines a footprint with five longitudinal segments associated with side rails 76, longitudinal bars 75, and end panels 63 and 64. The lower surface of the tray also is preferably constructed to have longitudinal base recesses 77 between bars 75 and side rails 76. Processing fluids drain from the wafers 50 and wafer tray 60 through the receiving slot openings 70 and base recesses 77.

The novel wafer trays 60 provide improved processing of wafers in processor 40. The improvements include improved access of processing fluids to the surfaces of wafers 50. The improved access of processing fluids occurs because there is less coverage of the wafers as compared to prior art carriers 51. Only relatively small marginal edge portions along the arc of the receivers is covered. Thus allowing almost full access to the faces of the wafers by processing fluids. The improved access to processing fluids in turn results in reduced processing times and greater uniformity and effectiveness of the processes upon the surfaces being treated. Wafer tray 60 also results in a small combined size of the wafer batch within processor 40. This translates into a much smaller overall size of processor 40 and reduced floor space requirements in clean rooms and adjacent gray rooms. Since the cost of floor space in these facilities is very high, the installed cost of the processing system 40 is kept relatively lower. These factors all attribute to better yields, improved quality and reduced costs of production.

Standard Wafer Carrier

Figure 5:
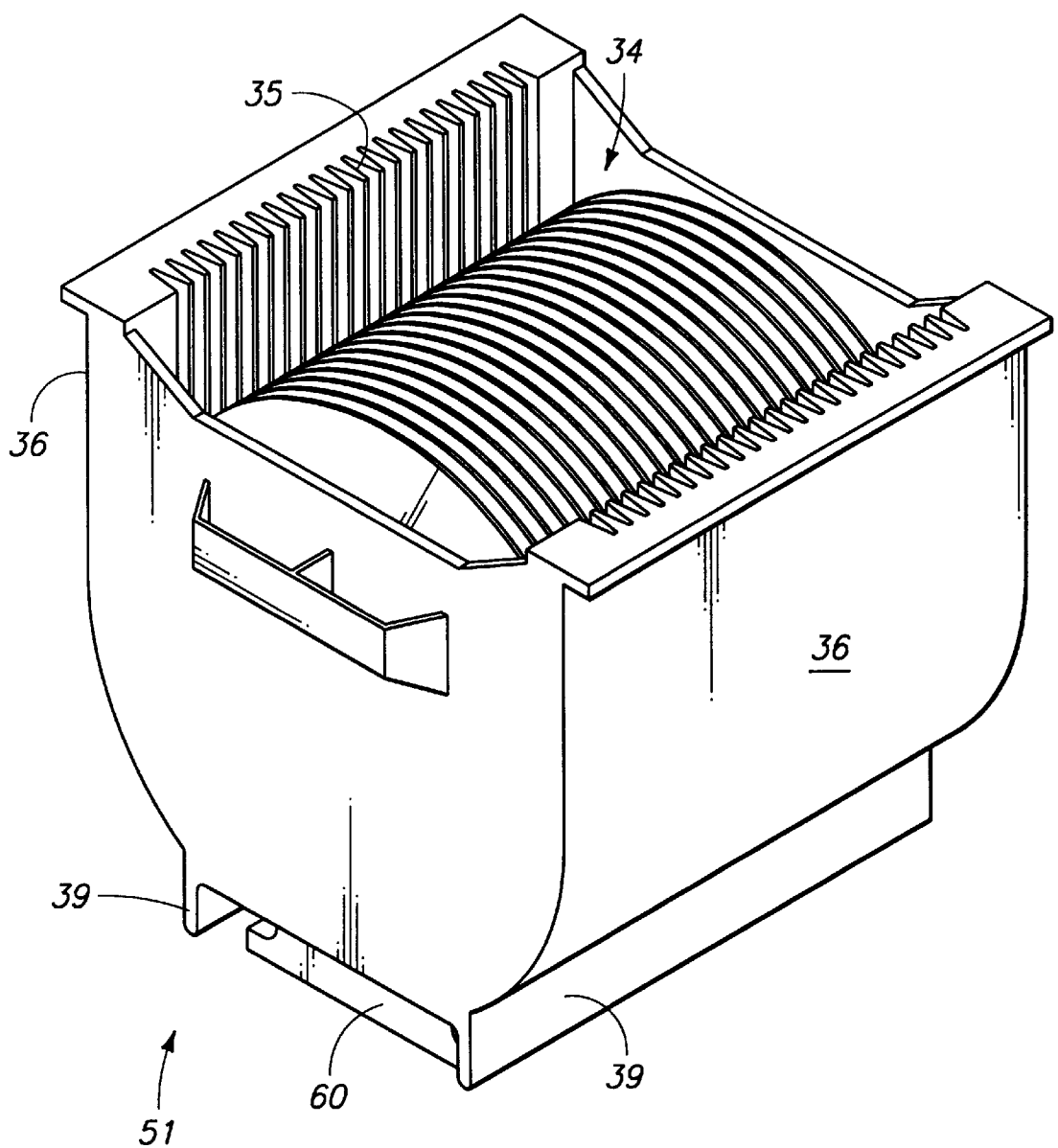
FIG. 5 is a perspective view showing a prior art industry standard wafer carrier loaded with wafers. The wafer holding tray of FIG. 2 is positioned below the wafer carrier.

Processor 40 is designed to work in conjunction with a standard industry wafer carrier which is illustrated in FIG. 5. Such carriers are available from a number of supplying manufacturers. Carrier 51 has a holding trough 34 with a series of edge receiving receptacles 35 along side walls 36. End walls 37 are typically provided with handles 38. The bottom of carrier 51 is provided with a bottom opening (not shown) which is rectangular and defined between base rails 39. FIG. 5 shows a wafer tray 60 positioned beneath wafer carrier 51 aligned to pass up through the bottom opening of the carrier. Wafer tray 60 is sized to pass through the bottom opening.

Interface Section

The interface section 43 takes the wafers from the wafer carriers and installs them onto the specially constructed wafer trays 60. The wafer trays provide improved processing of wafers 50. The interface section also preferably provides a holding or inventorying capability for both wafers awaiting processing and wafers which have been processed. Thus the interface section constructed as shown in FIG. 1 functions as both an input subassembly, output subassembly and wafer holding station.

Interface 43 is substantially enclosed by the enclosure envelope 45. Interface 43 has open work spare portions connected to the portions of work space 46 contained within the processing section 44. The interface includes a interface port 56 formed through envelope 45. Interface port 56 allows wafers to be loaded into and removed from processor 40. Interface port 56 is preferably provided with a interface port closure in the form of a movable door 59. Movable door 59 is powered and extends upwardly from below to close the port and is retracted downwardly to open the port. This construction allows the interface port door to be automatically controlled to the extent desired.

FIGS. 6–12 show the principal operational portions of interface 43. These portions serve to provide a wafer transfer which transfers wafers from the industry standard wafer carriers 51 and installs the wafers onto the novel wafer trays 60. Additionally, interface 43 serves to hold wafer batches loaded onto the trays. These loaded tray batches are held for processing in the processor. Still further interface 43 allows for the storage of unloaded wafer trays. As shown, interface 43 also performs loading and unloading operations through interface port 56.

Figure 6:
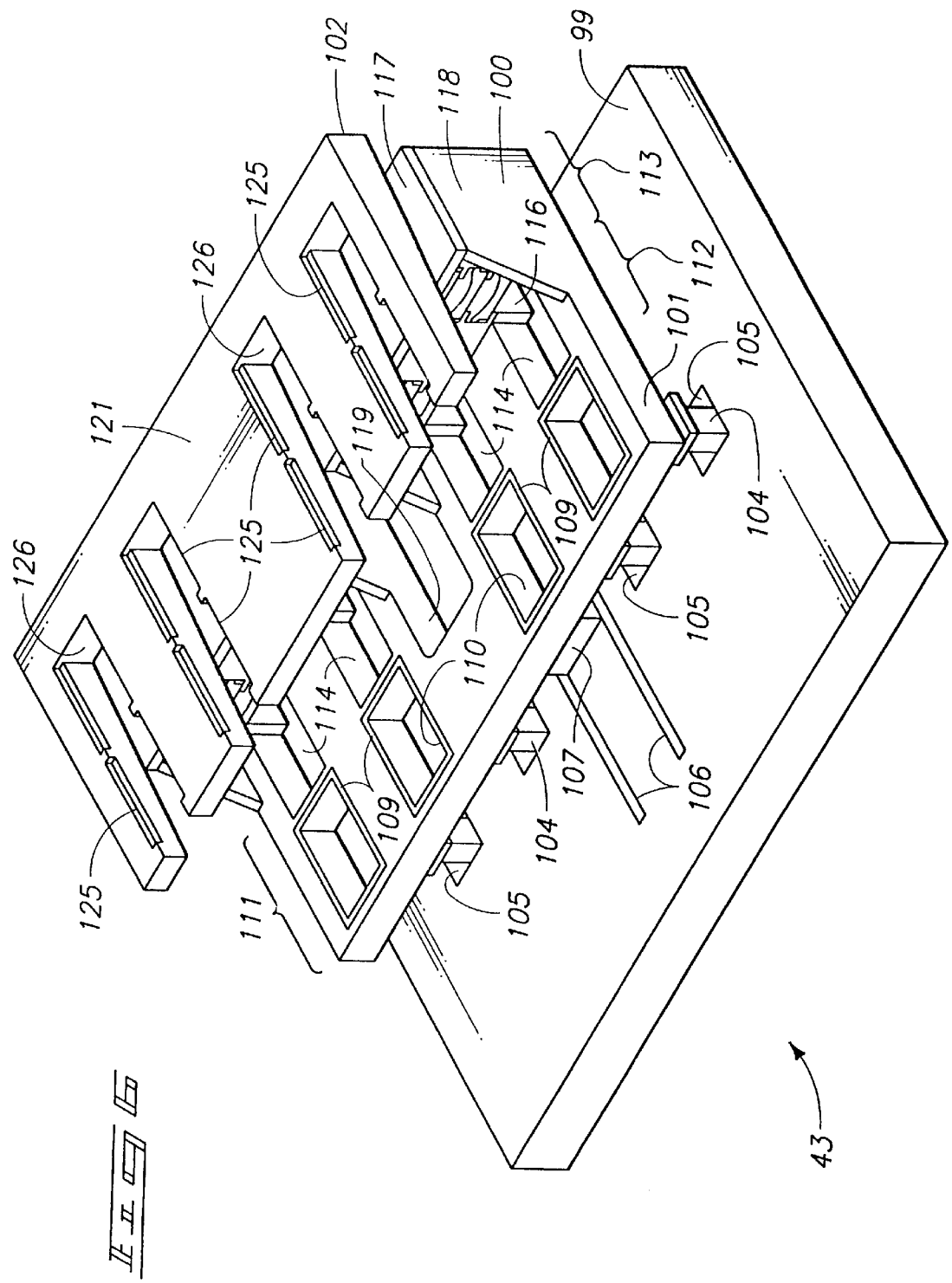
FIG. 6 is a perspective view showing portions of a wafer handling subsystem used in the processing system of FIG. 1.

FIG. 6 shows that the preferred interface 43 has a base 99 which is secured to frame 41. A first or lower carriage 100 is mounted for movements, such as the preferred horizontal movement. A second or upper carriage 102 is also mounted for horizontal movement. Interface 43 also has four elevators 104 which provide vertical movement.

Base 99 in some respects acts as an extension of frame 41 and further serves to separate the interface section compartment into an interface section portion of working space 46 and a mechanical compartment 98 (FIG. 1) which is below and subjacent to the working space and base 99. As shown, base 99 is provided with four elevator openings 102 which serve as apertures through which elevators 104 extend.

Base 99 also is provided with first carriage travel openings or clefts 106. Clefts 106 receive portions of a first carriage support pedestal 107 which extend downwardly from the first carriage beneath base 99. The pedestal extends down to a first carriage support track (not shown) which is below base 99 in the mechanical compartment 98. Pedestal 107 is connected to a first carriage operator (not shown) which is advantageously in the form of a rotatable linear screw drive operator similar to the operator described below in connection with second carriage 102.

FIG. 6 also shows that interface 43 includes two carriages 100 and 102 which are movable relative to elevators 104. Carriages 100 and 102 are preferably mounted for simple linear motion relative to the elevators. However, alternative configurations and movement patterns may be possible. Carriages 100 and 102 are independently operable or otherwise controllable to allow different relative horizontal positions and movements of the first and second carriages.

As shown, first carriage 100 is positioned above base 99 and below the second carriage 102. This preferred configuration results in the first carriage functioning as a lower carriage, and the second carriage functioning as an upper carriage. Elevators 104 serve to move wafer batches between a first or upper carriage level associated with the first carriage and a second or lower carriage level associated with the second carriage.

First carriage 100 includes an outer or forward portion forming a first section 111 of the carriage. This outward section is in the form of a cantilevered shelf or carrier support projection 101. Carrier support projection 101 serves to support wafer carriers 51 thereon. First carriage 100 is laterally movable to extend the carrier projection or overhang through interface port 56 into the fully extended first carriage receiving position illustrated in FIG. 1. The overhanging carriage shelf 101 is provided with carrier support features which are advantageously in the form of carriage support ledges 109. The carrier support ledges are preferably recessed areas formed in the upper surface of shelf 101. The carrier support features are advantageously constructed to provide lateral support against unintended horizontal displacement in either X or Y directions (see FIG. 1). The carrier support features also hold the carriers to prevent downward movement from a desired vertical or Z position, but allow vertical movement above the shelf for easy installation and removal of the wafer carriers.

The carrier support ledges 109 or other carrier support features are preferably positioned adjacent or about first carriage transfer openings 110. The support ledges are most preferably peripheral recessed areas about the opening 110. Openings 110 are provided to allow extension of the elevators 104 therethrough. Extension of the elevators through openings 110 is used in conjunction with the transfer of wafers between the wafer carriers 51 and wafer trays 60 in either incoming or outgoing directions.

First carriage 100 also preferably includes a second or central section 112 which includes a group of four first carriage pass-through openings 113. Pass-through openings 113 extend through the deck of the first carriage to allow extension of the elevators therethrough. Pass-through openings 113 also allow unloaded wafer trays 60 to be passed upwardly and downwardly through the first carriage deck in a manner as explained more fully below.

First carriage 100 is further provided with a third or rearward section 113. Rearward section 113 includes an empty or unloaded wafer tray magazine or storage 115. The empty wafer tray storage is advantageously in the form of four arrays each having three receptacles to receive three wafer trays therein. The receptacles each include shoulder pairs which function as rests upon which the side rails 76 of the wafer trays rest. The shoulder pairs are along arranged along opposing sides of an empty tray gallery 116 which is common to all three receptacles of a single storage array 115. Galleries 116 allow the heads of the elevators to extend upwardly to engage empty wafer trays and lift them for removal from the storage array. The empty tray gallery also extends through the deck of the first carriage, and is contiguous with and open to the adjoining pass-through openings 114.

The empty tray storage is also preferably provided with an empty tray storage roof panel 117 which extends over and protects the empty wafer trays from downwardly drifting contaminating particles. The roof panels are supported by first carriage rear section support panels 118.

The first carriage is further advantageously provided with a second carriage pedestal inlet opening 119 which allows a support pedestal of the second carriage to extend thereinto when the second carriage is moved forwardly.

Interface 43 also includes the second or upper carriage 102. Upper carriage 102 has an upper carriage deck 121 which is supported by a second carriage support pedestal 122. Pedestal 122 has a linear drive operator 123 which is advantageously in the form of a rotatable screw drive 124 which moves the second carriage forwardly and backwardly between retracted and extended positions.

The upper carriage is provided to function as a loaded tray holding or inventorying station. As shown, this function is accomplished by having the second carriage in a position above the first carriage, and provided with a series of loaded tray holders 125. Loaded tray holders 125 are formed as receptacle ledges formed in the deck. The receptacle ledges are adjacent to second carriage elevator openings 126. Openings 126 are preferably portal openings which have open entrances at the forward ends thereof. As shown, the upper carriage is configured to hold two groups, each group having four wafer trays in a four by two loaded wafer tray storage array.

Interface 43 also includes elevators 104 which have elevator rods or shafts 128 and enlarged elevator heads 129. The elevator heads are constructed to engage the lower surface 62 of wafer trays 60 in a stable manner. Most preferably the upper contacting face of elevator head 129 is provided with four engagement projections 130 at the front and back of the contacting face. The engagement projections are spaced and sized to fit within the longitudinal recesses 77 of trays 60 adjacent the end panels. This provides positive engagement against lateral displacement of the trays relative to the elevator head during automated handling of the wafer trays by the interface.

Interface 43 is advantageously constructed to handle wafer carriers and wafer trays in groups or gangs of four at a time. Although this configuration is preferred, it is alternatively possible to have other gang sizes.

Operation of Interface Section

Figure 7:
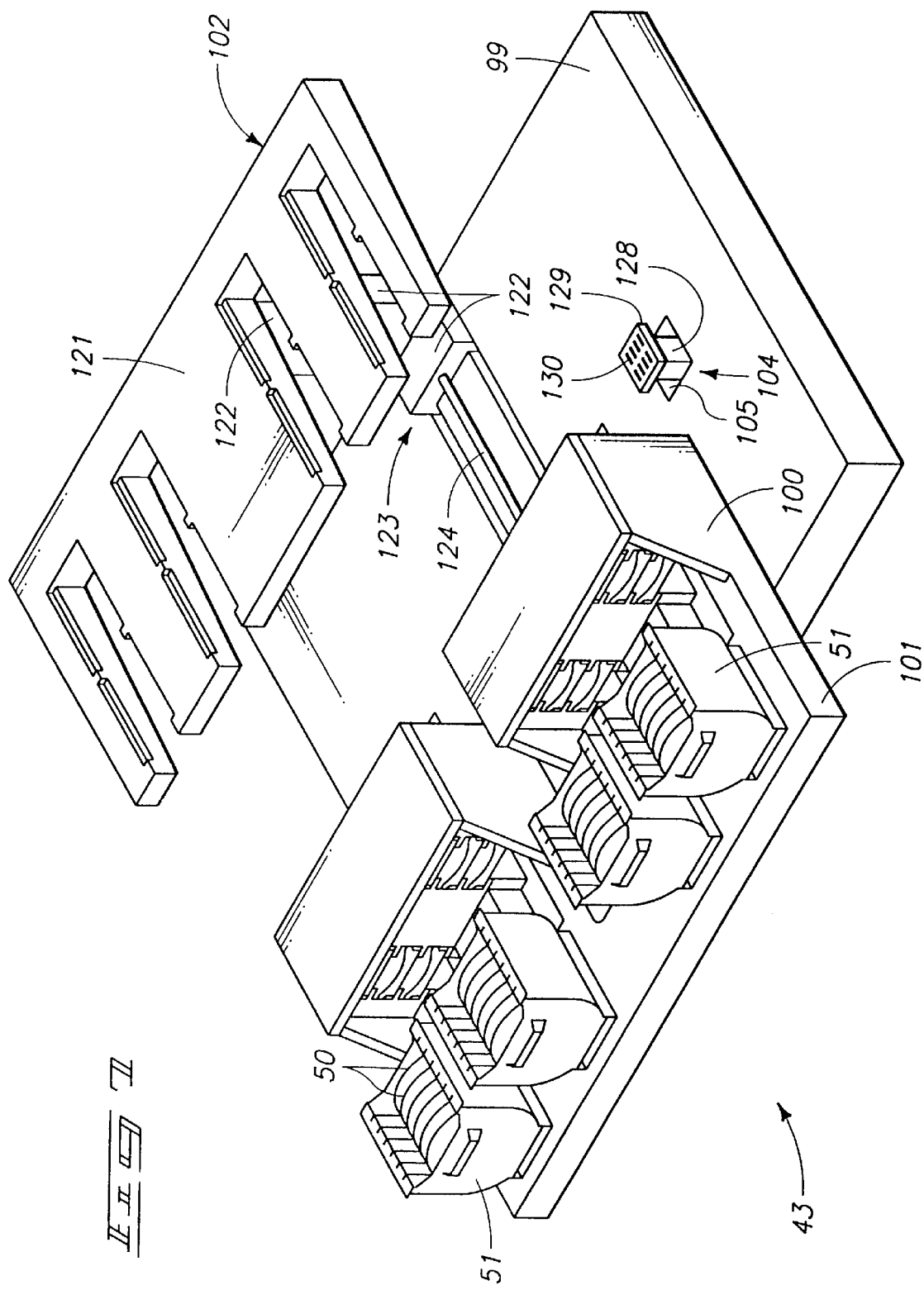
FIG. 7 is a perspective view of the subsystem of FIG. 6 moved into an initial loading position with wafer carriers containing wafers loaded thereon.
Figure 8:
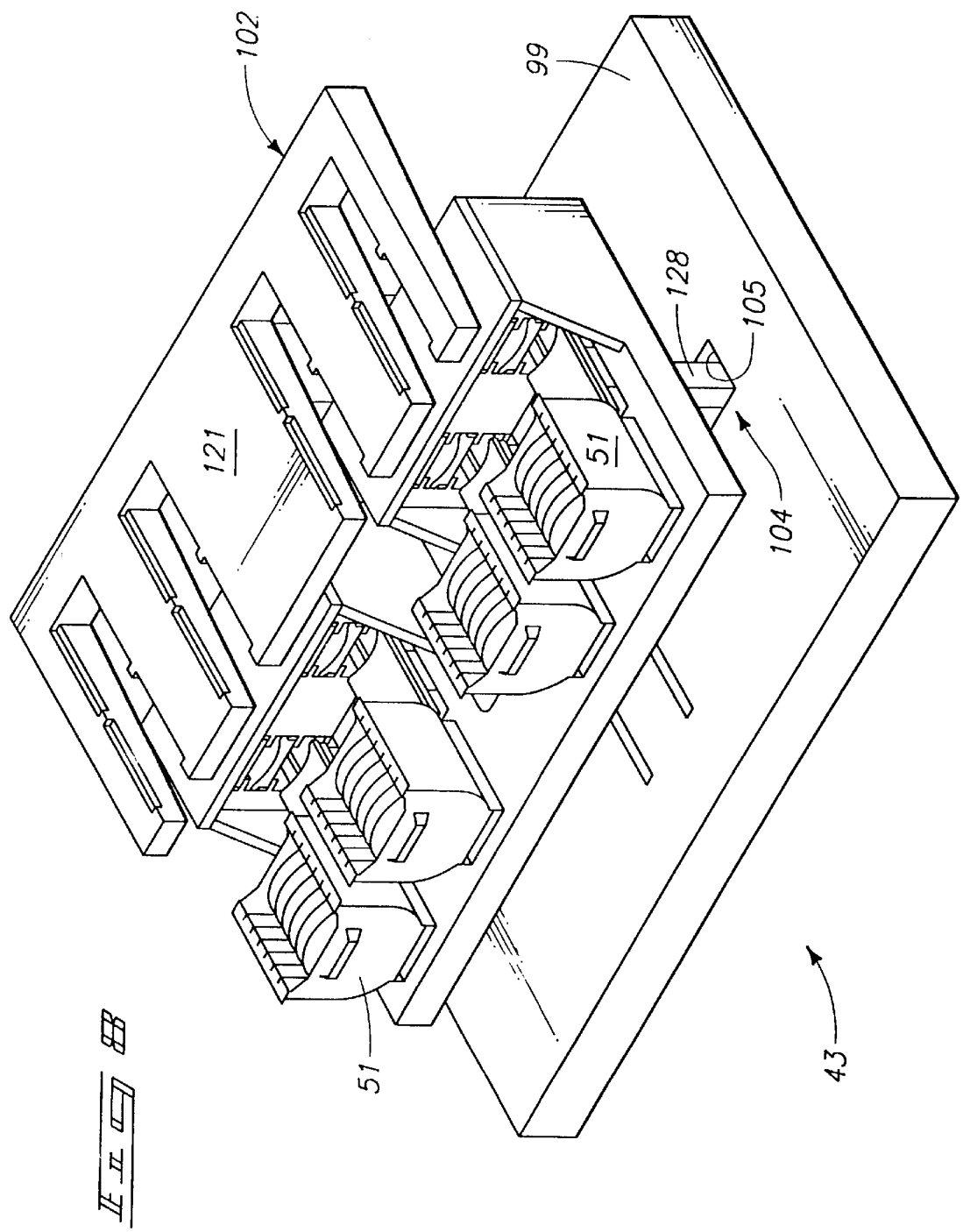
FIG. 8 is a perspective view showing the subsystem of FIG. 6 moved into a further position wherein empty wafer trays are passing through a tray pass-through opening.

The operation of interface 43 will now be described in connection with the series of drawings shown in FIGS. 7–12. FIG. 7 shows the interface moved from the fully retracted positions of FIG. 6 into an initial loading position wherein the first carriage has been extended fully to position the overhanging carrier shelf 101 through the interface port 56. FIG. 7 also shows the carrier shelf loaded with four wafer carriers 51 containing wafers 50. The carriers and wafers are positioned in the carrier support receptacle ledges 109 over the wafer transfer openings 110. The second carriage 102 is maintained in the fully retracted position.

After the wafer carriers have been loaded onto shelf 101, the first carriage is retracted. When sufficiently retracted, the interface port door 59 is closed by extending the door upwardly. The first carriage continues to retract rearwardly until the elevator head 129 is aligned with the stored trays held in empty wafer tray storage arrays 115. At this tray pick position, the first carriage is stopped and the elevators are aligned below the stored wafer trays. The elevators are then extended upwardly to engage and lift the lowest empty trays from the four storage arrays. The elevators are then stopped and held at a tray lift elevation position.

The first carriage is then retracted further to bring the pass-through openings 114 into alignment with the elevators and elevated empty wafer trays positioned upon the heads of the elevators. At this pass-through position of the first carriage, the first carriage is stopped. The elevators 104 are then retracted downwardly to pass the empty wafer trays through the deck of the first carriage. The empty trays are move downwardly until they are below and clear of the first carriage.

Figure 9:
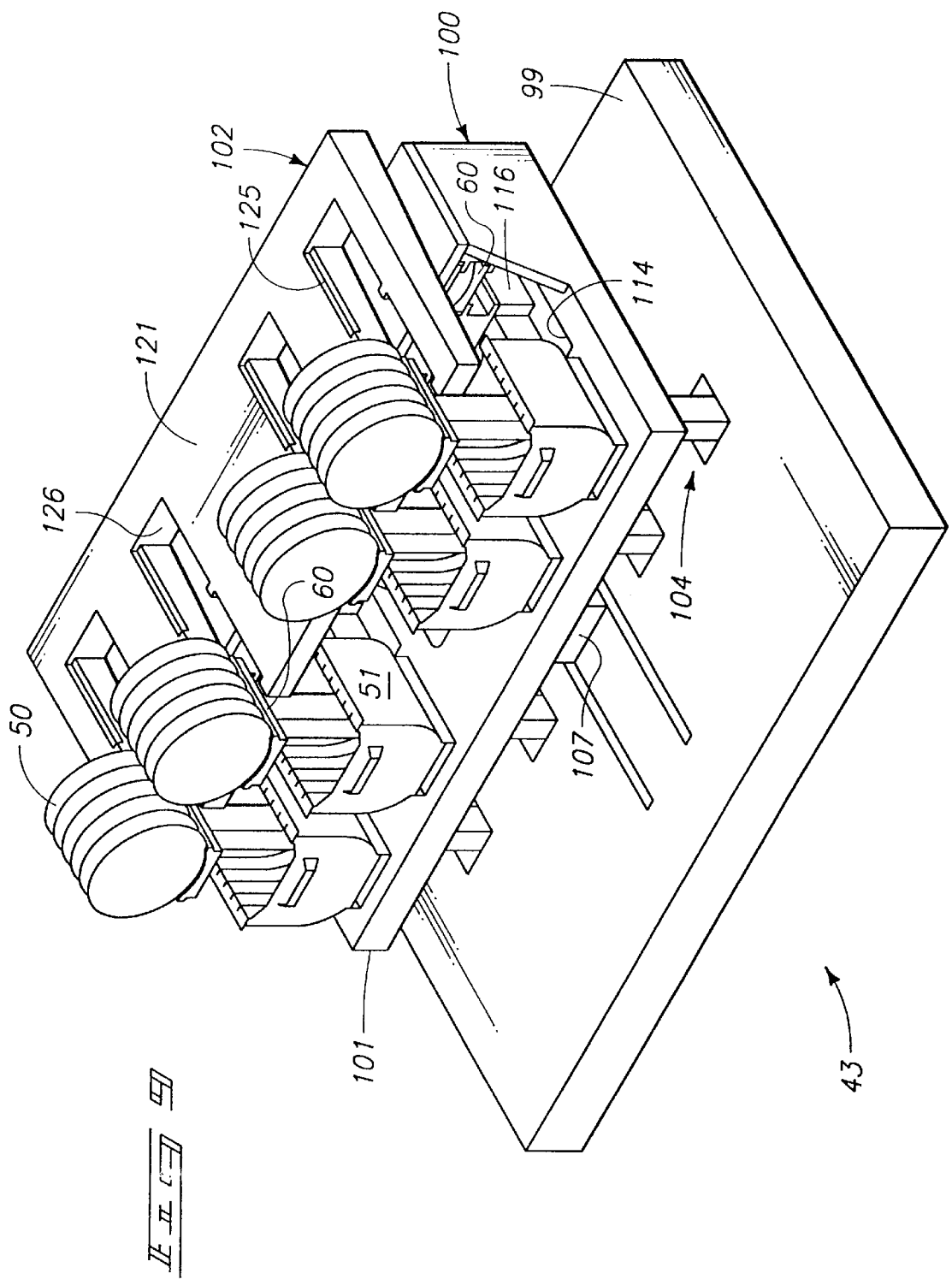
FIG. 9 is a perspective view showing the subsystem of FIG. 6 moved into a further position wherein the wafer trays have been elevated up through the wafer carriers to lift wafers from the carriers onto the trays.
Figure 10:
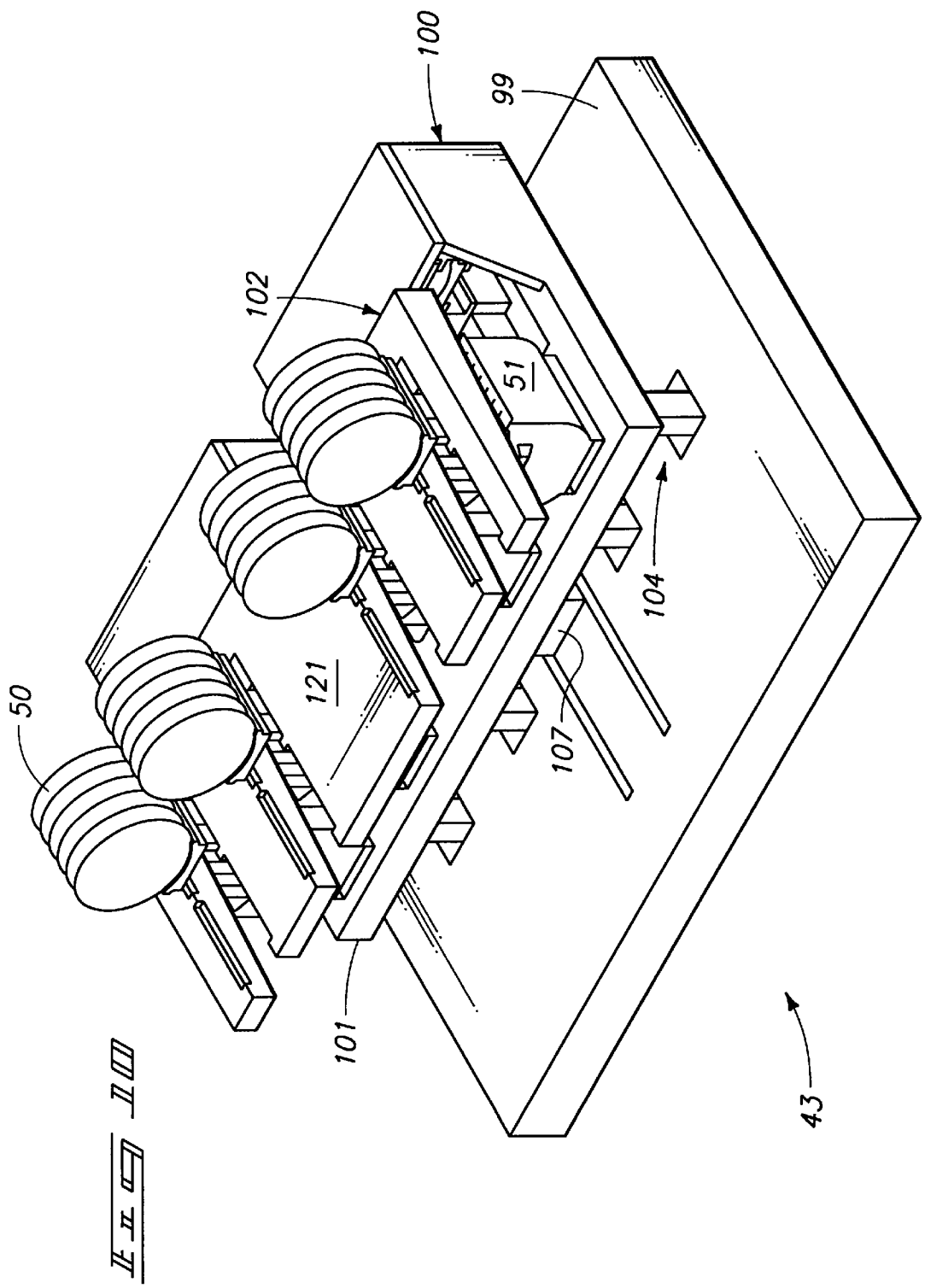
FIG. 10 is a perspective view showing the subsystem of FIG. 6 moved into a still further position wherein the wafer trays with wafers are positioned upon an upper carriage.

The first carriage is then moved rearwardly from the pass-through position into a transfer position. In the transfer position the first carriage is positioned so that the elevators and empty wafer trays held thereon are aligned with the bottom opening of the wafer carriers held in carrier holders 109. FIG. 9 shows the first carriage in the first carriage transfer position.

FIG. 9 further illustrates the transfer of wafers from the wafer carriers 51 and their installation onto the wafer trays 60. In FIG. 9 the elevators have been extended upwardly after the first carriage has assumed the transfer position. The transfer includes aligning the individual wafer receivers 66 below the wafers 50 held in carriers 51. As the elevators extend upwardly, the tray moves up, into and through the open bottom of carriers 51. The edges of the wafers 50 are guided by the V-shaped receiver mouths having downwardly converging receiver side surfaces 67. The edges of wafers 50 are guided by the receiver mouths into the relatively close fitting receiver slots or channels 68. The edges of the wafers bear against the wafer slot bottom surfaces 69. The bearing allows the wafers to further be lifted upwardly by the elevating trays 60.

Figure 11:
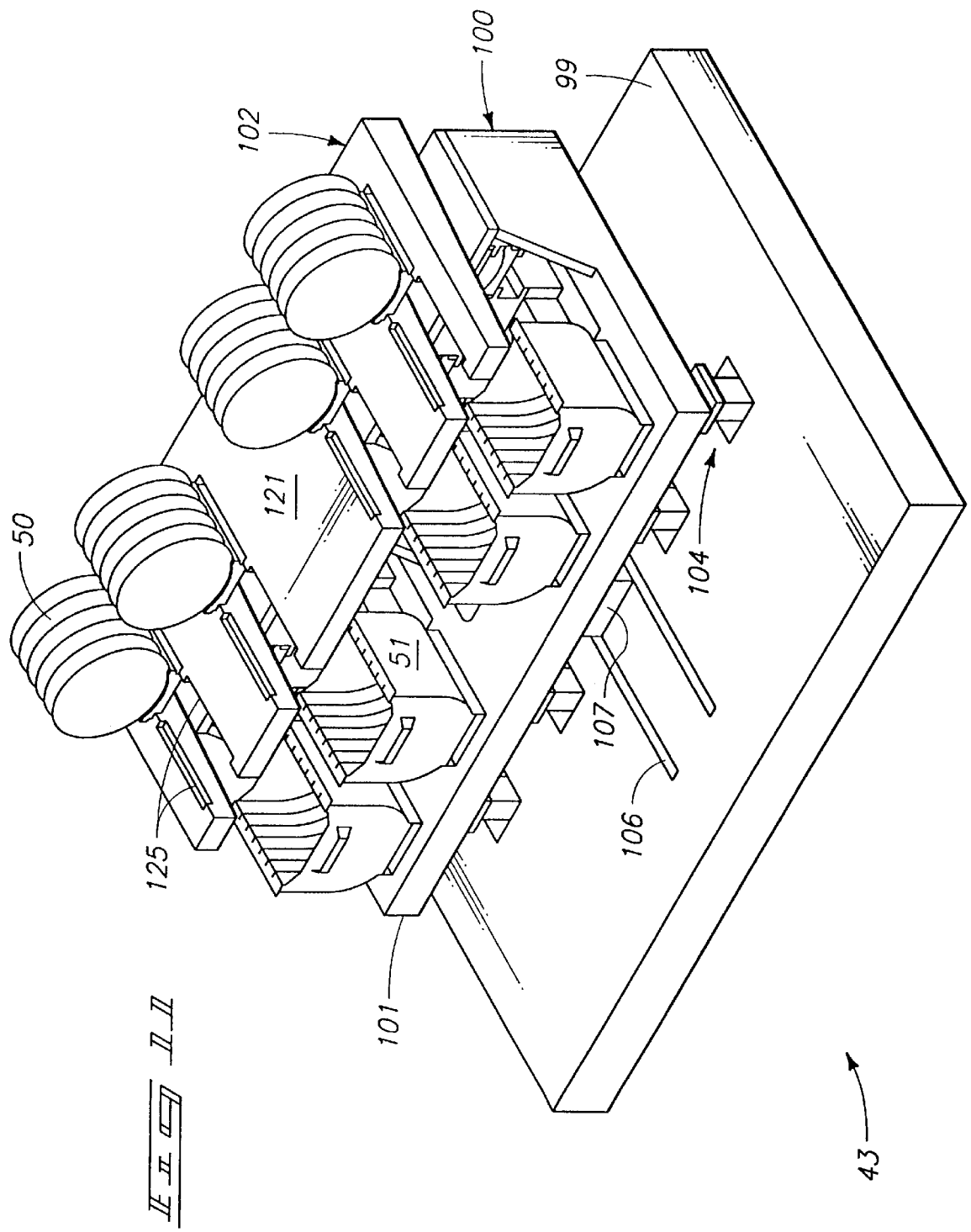
FIG. 11 is a perspective view showing the subsystem of FIG. 6 with the upper carriage and supported wafers and wafer trays positioned for holding until subsequently processed in the system processing chambers.

FIG. 9 shows the elevators fully extended with trays 60 fully elevated and with wafers 50 held in an aligned side-by-side array upon the trays. In this condition, interface 43 has transferred the wafers and the loaded wafer trays are ready to be moved to the holding stations on second carriage 102. To accomplish this, the second carriage is extended outwardly and forwardly from the retracted position into an extended position, such as the fully extended position shown in FIG. 10. In this position the second carriage has been moved forwardly so as to align the rearward gang of loaded tray holding receptacles 125 with the elevated wafer trays. The elevators are then retracted downwardly to lower the loaded wafer trays into the receptacles 125. After the loaded trays have been received in receptacles 125, the second carriage can then be retracted rearwardly into a retracted holding position, such as shown in FIG. 11. FIG. 11 also shows the elevators 104 fully retracted and the first carriage retracted with empty wafer carriers 51 awaiting discharge from the interface section.

Figure 12:
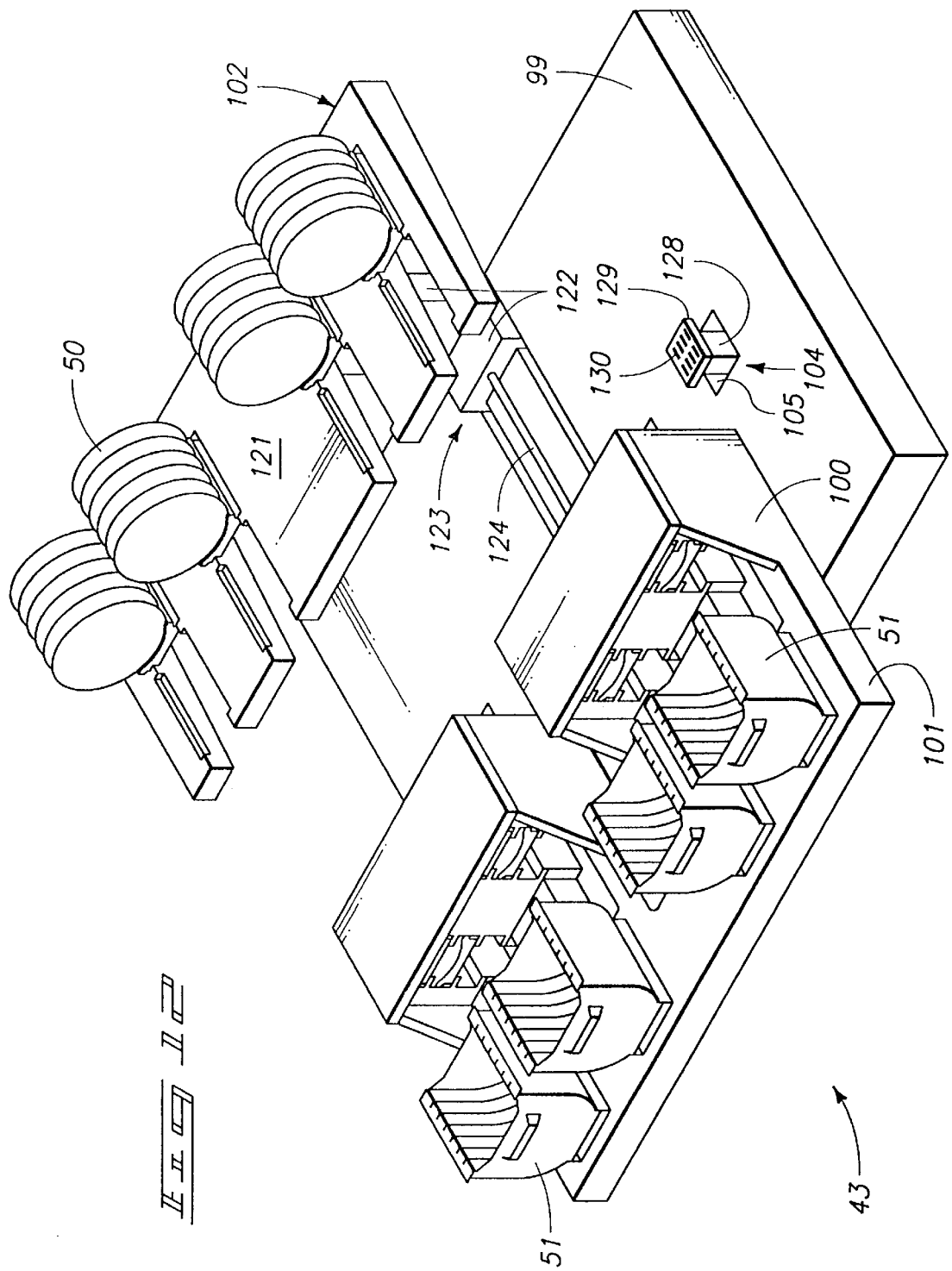
FIG. 12 is a perspective view of the subsystem of FIG. 6 in a position similar to FIG. 7 with the emptied wafer carriers ready for removal and replacement by loaded wafer carriers so that a second group can be transferred in a process similar to that illustrated by FIGS. 7–12.

FIG. 12 shows the first carriage repositioned into a fully extended carrier unload position. This position is also the initial load position shown in FIG. 7. The empty wafer carriers are removed using a suitable means, such as manual removal by a human operator (not shown). Loaded wafer are then loaded onto the overhanging shelf of the first carriage and the process illustrated by FIGS. 7–12 is repeated for a second gang or group of carriers, wafers and trays. The second loading process differs only slightly from the process described above. One difference is that different trays are used from the empty tray storage magazines 115. Another difference is that the second gang of loaded trays are held in the outer or forward holding receptacles 125 instead of the rearward tray holders used by the first gang of wafer trays.

Processing Section

The processing section 44 of processor 40 will now be described in greater detail. As shown, processing section 44 includes three centrifugal processing stations 71–73. Each processing station includes a processing chamber bowl 131 which substantially encloses an internal processing chamber 132. A centrifugal processing enclosure door 134 is mounted for controlled powered vertical motion between a closed upward position and a downwardly retracted open position. Preferred door constructions are shown in U.S. Pat. No. 5,302,120, which is hereby incorporated by reference.

Figure 31:
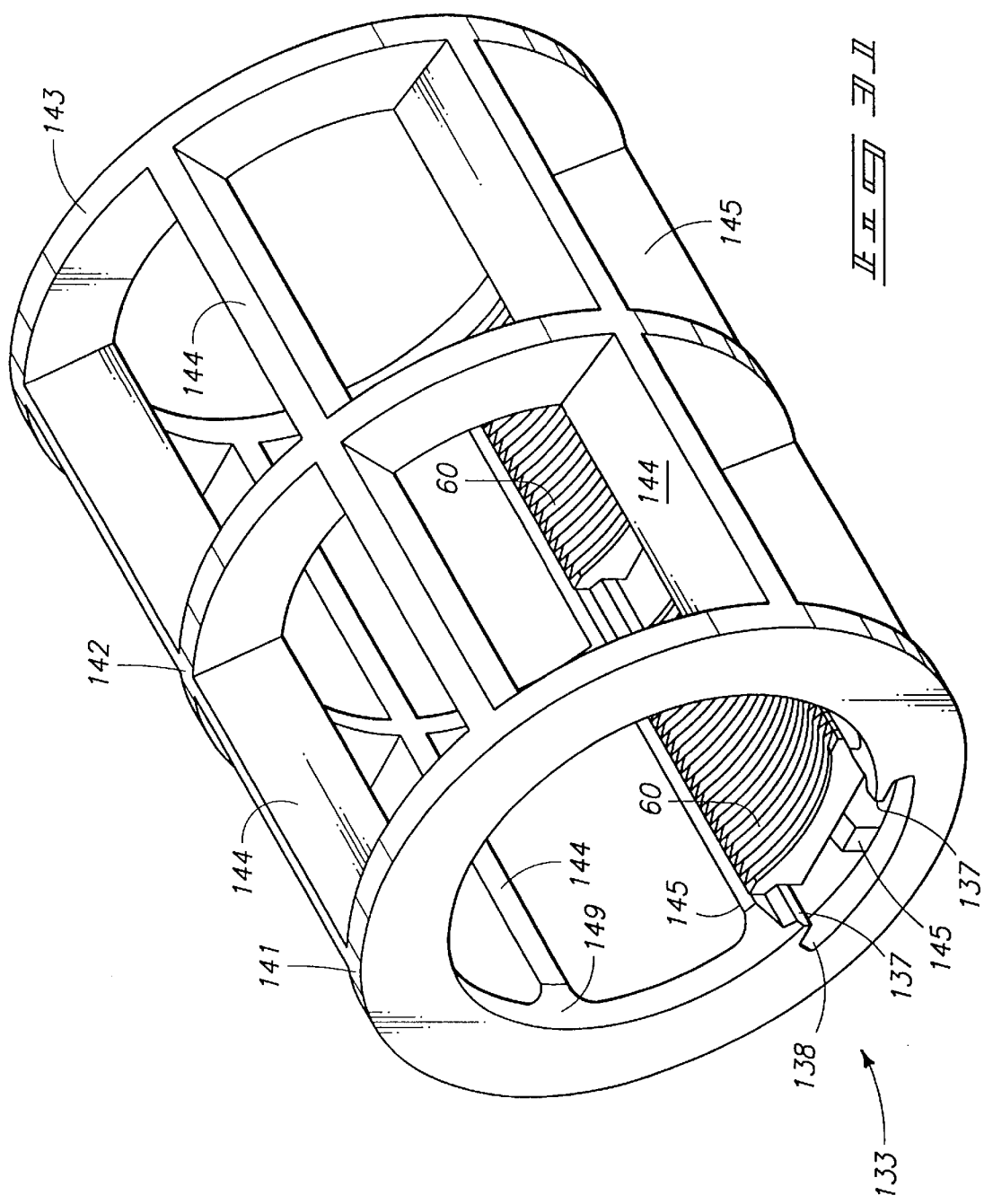
FIG. 31 is an isometric view of a preferred centrifugal processing rotor used in the centrifugal processing modules shown in FIG. 1.
Figure 33:
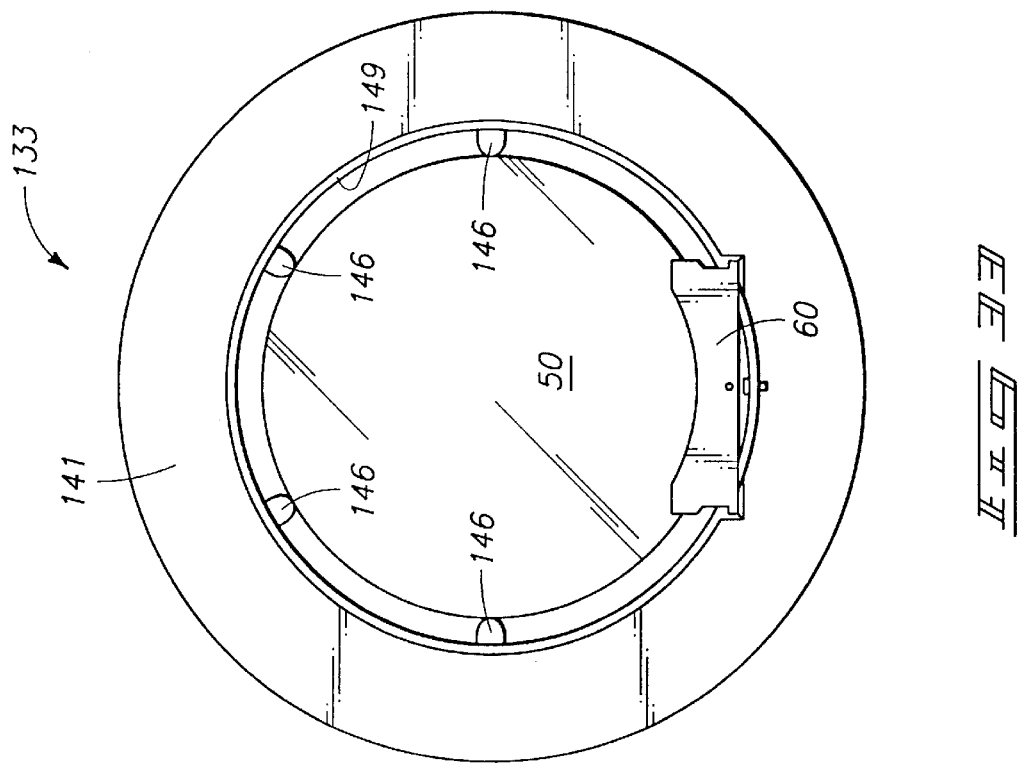
FIG. 33 is a front view of the rotor as shown in FIG. 32 with a wafer tray held within the rotor.
Figure 32:
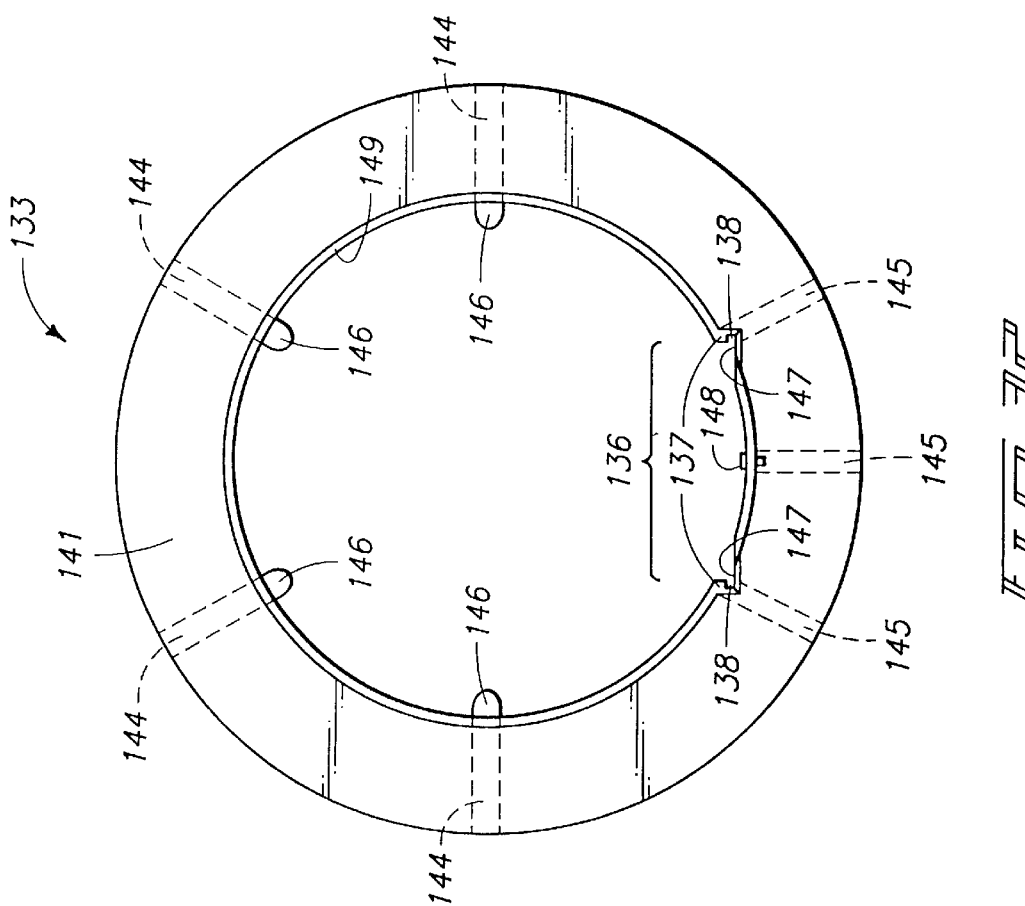
FIG. 32 is a front view of the rotor shown in FIG. 24.

Within each processing chamber is a suitable rotor for receiving loaded wafer trays, such as rotor 133 detailed in FIG. 31. FIG. 32 shows a front view of rotor 133 without a wafer tray loaded therein. FIG. 33 shows a front view similar to FIG. 32 with a loaded wafer tray positioned within the rotor. Rotor 133 is specially constructed to receive and appropriately engage wafer tray 60 using wafer tray engagement features as explained below. The resulting interlocking interengagement of the tray with the rotor substantially prevents dislodgement until appropriately removed.

Rotor 133 includes three principal ring pieces 141–143. The front ring 141 has a beveled rotor opening 149. The front, central and rear rings are connected by connecting longitudinal bars 144 and 145. Upper longitudinal bars 144 are spaced from the wafer trays 60 and are provided with inwardly directed longitudinal bumpers 146. Adjacent the wafer tray receptacle 136 are three additional longitudinal bars 145. The inward edges of bars 145 serve to guide and support wafer trays 60 appropriately positioned within the wafer tray receptacle.

The wafer tray engagement features used in the wafer tray receptacle include a rotor tray receiving channel 136. The sides of receiving channel 136 include rotor tray engagement projections 137. The rotor tray engagement projections are shaped and sized to complement and be received along the tray side channels 81. However, the tray side channels are substantially higher than the engagement projects because the trays are loaded using a tray engagement tool 180 which inserts between the downward facing bearing surface 82 of the tray and the upward surface of rotor engagement projections 137. Additionally, the clearance is preferably sufficient so that engagement tines 184 can also pass through the available space during insertion into the rotor to retrieve a tray therefrom.

The wafer tray engagement features used in rotor tray receiving channel 136 also include opposing side receiving flutes 138. Flutes 138 receive the longitudinal side flanges 85 of tray 60 in relatively close fitting interengaging relationship. The bottom or foot surface 86 of tray 60 bears upon inwardly directed tray support surfaces 147 on the longitudinal bars 145. This advantageously occurs between both outer support bars 145 with both side rails 76 of the tray, and along a central tray support bar 145 and the center longitudinal foundation bar 75 of the tray. Central longitudinal bar 145 is advantageously provided with a bumper bar 148 (FIG. 32).

The processing stations are each independently driven by rotating assembly motors 153 and have other features of a centrifugal fluid processor as needed for the desired processing of that station. Additional details of a preferred construction of centrifugal processor are well-known or can be taken from the attached Appendix hereto.

The specific processing performed in processing stations 71–73 can each be different or of similar nature. Various liquid and gaseous processing steps can be used in various sequences. The processor is particularly advantageous in allowing a series of complex processes to be run serially in different processing chambers set up for very different chemical processing solutions. All the processing can be accomplished without human handling and in a highly controlled working space, thus reducing contamination and human operator handling time.

The processing section 44 also includes a processing section portion of working space 46. This portion of the working space is frontward of processing stations 71–73 within the enclosure envelope 45. This processing section working space allows the tray conveyor described below to supply and remove loaded wafer trays to and from the processing stations.

Conveyor

Figure 13:
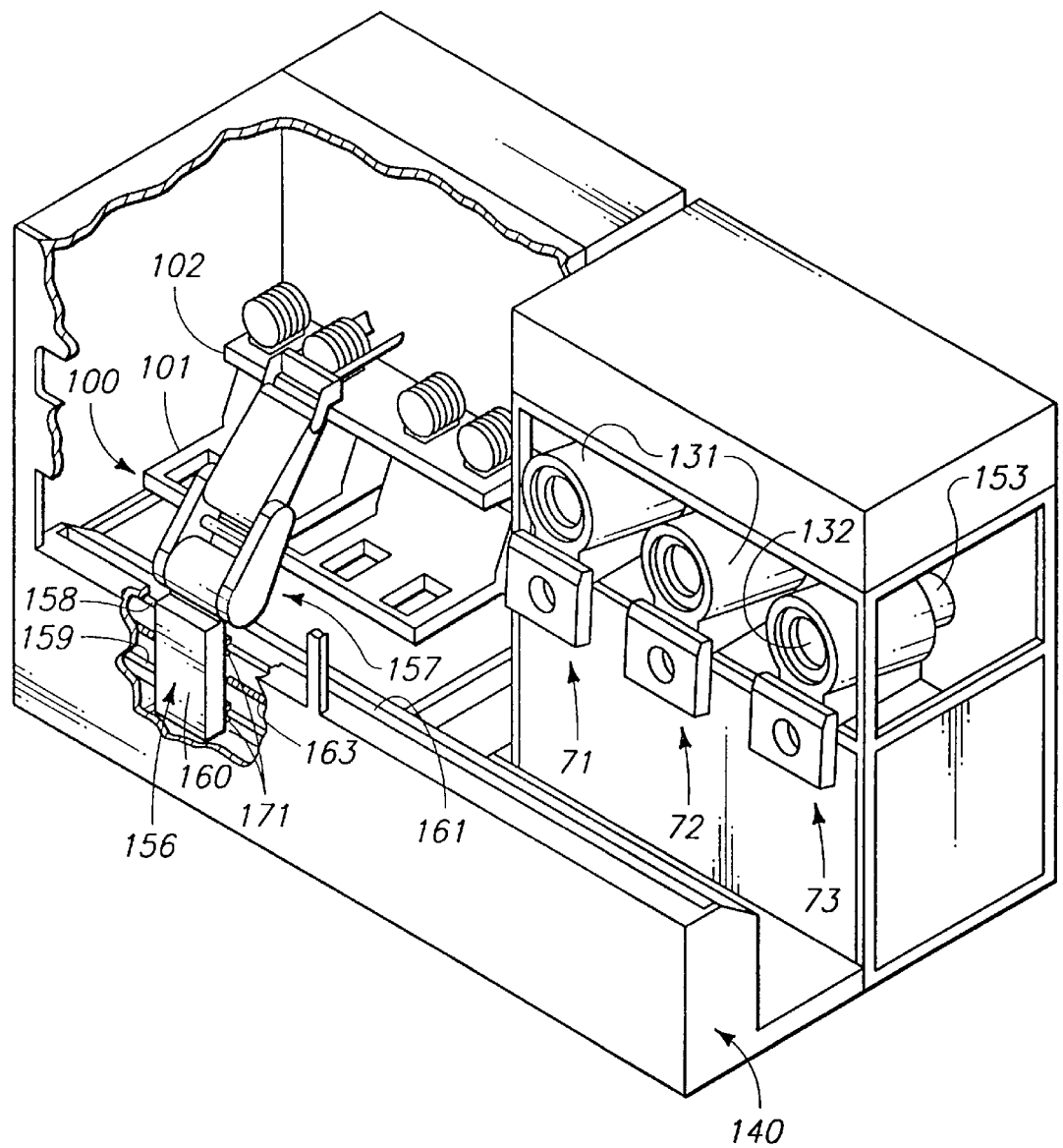
FIG. 13 is a perspective view showing the wafer processing system of FIG. 1 with a robot conveyor loading a tray of wafers.
Figure 14:
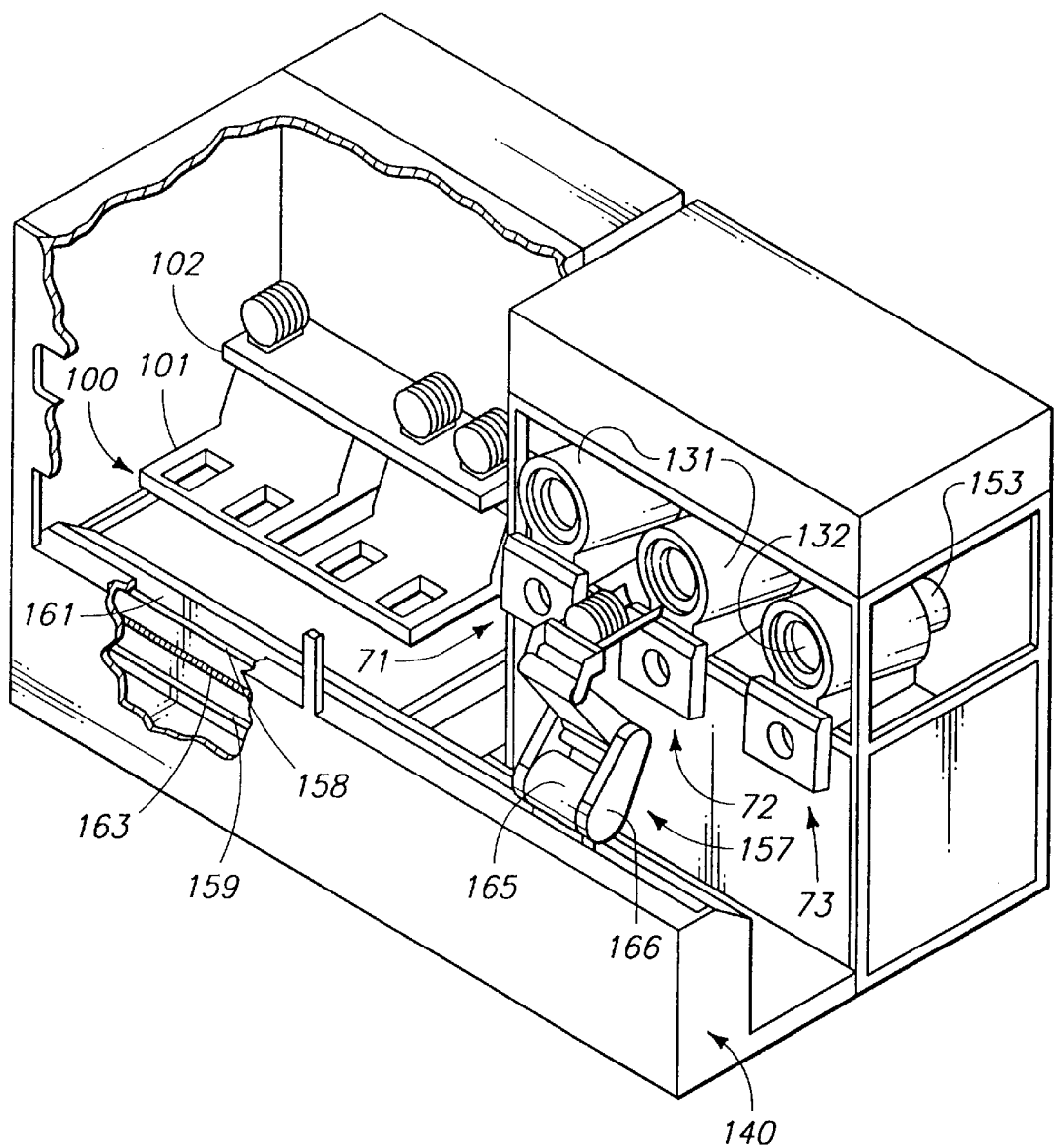
FIG. 14 is a perspective view similar to FIG. 13 with the robot conveyor relocated and preparing to install the tray wafers into a centrifugal processing module.

Processor 40 is advantageously provided with a mechanical wafer tray conveyor 140. Conveyor 140 will be described initially with reference to FIGS. 13 and 14. The preferred conveyor includes a conveyor carriage or tram 156 and a mechanical arm assembly 157 which is mounted on the tram. The tram moves the mechanical arm assembly along a defined tram travel path. The mechanical arm assembly moves the wafer trays 60 upwardly, downwardly, inwardly, outwardly, and adjusts the tilt within a range of available positions and orientations.

Tram 156 has a base 160 which connects with a base subassembly 165 which forms part of the mechanical arm assembly (see FIG. 35). The complementary base parts 160 and 165 join to provide a combined base assembly which serves as a movable base for the mechanical arm assembly.

Tram 156 moves along a guide track which defines the tram path along which the tram travels. The guide track is advantageously formed by upper and lower guide bars 158 and 159 which are mounted along the outward side of a track support member 161 forming part of the frame. This construction allows the mechanical arm assembly to extend into cantilevered positions to reach processing stations 71–73 with good positional stability. The guide bars are engaged by track followers in the form of linear bearings 171 which are secured to the inward face of the tram base 160. The linear bearings 171 are advantageously provided with rod engaging rollers spaced at equal 120° arc positions about the guide bars 158 and 159.

The tram is powered along the defined path guide track by a suitable tram driver, such as a track magnetic drive in the form of linear magnetic motor 163. Linear magnetic motor 163 is most preferably a linear brushless direct current motor. Such a preferred tram driver uses a series of angled magnetic segments which magnetically interact with an electromagnet on the base of the robotic conveyor to propel the tram and attached mechanical arm up and down the defined path track.

The path position of the base 160 along the guide track is precisely controlled using a positional indicating array (not shown) affixed to the front of the track support member adjacent to guide bars 158 and 159. An optical emitter detector pair (not shown) are mounted upon base piece 160. The optical emitter detector pair serves as a track position sensor or indicator which reads the position of the tram base from the indicating array after proper calibration. The positional accuracy of the track position indicator is preferably in the range less than 0.003 inch (approximately less than 0.1 millimeter).

FIG. 35 shows the mechanical arm assembly 157 in a simplified form for purposes of illustrating and introducing the preferred construction. Mechanical arm assembly 157 is preferably of a type which can provide highly accurate positional stability and repeatability for precise control and movement of the loaded wafer trays which are supported at the distal end of the mechanical arm. As shown, mechanical arm assembly 157 includes a base portion 165 which is secured to tram base piece 160. An upper arm assembly having two complementary upper arms 166 are mounted to pivot relative to the body portion 165. Upper arms 166 are preferably connected together so as to provide coincident angular movement using an upper arm connection member, such as torque tube 167. The upper arm assembly pivots with respect to the base about a shoulder pivot axis 168.

Figure 15:
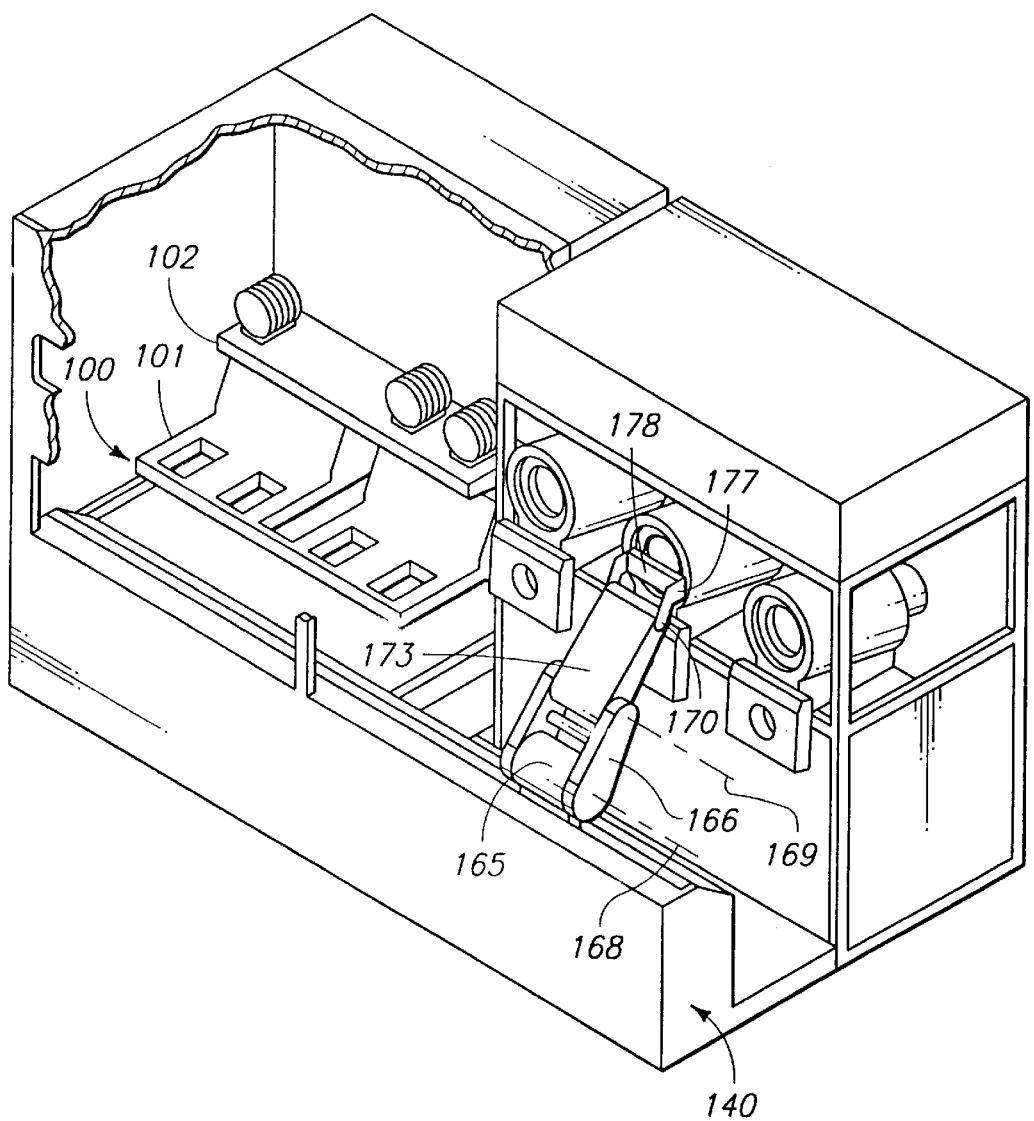
FIG. 15 is a perspective view similar to FIG. 14 with the robot extended into a loading position wherein the tray of wafers is installed in the centrifugal processing module.

A forearm assembly is connected near the outer distal end of the upper arm assembly. The forearm assembly advantageously includes two forearms 172 which are joined by a forearm connection member 174. The forearm assembly also uses opposing face panels 173 (FIG. 15) to provide a strong and mechanically integrated forearm assembly which is resistant to twisting and provides a high degree of positional stability. The forearm assembly is connected to the upper arm assembly to allow relative pivotal movement about an elbow pivot axis 169.

The distal end portions of the forearm assembly support a hand assembly 176. Hand assembly 176 is supported in a manner allowing pivotal movement about a wrist pivot axis 170. The hand assembly includes two complementary hand bars 177. Hand bars 177 are joined together by a hand cross piece 178. The hand assembly also preferably includes a tray engagement tool 180 which is mounted to the hand cross piece 178.

Figure 29:
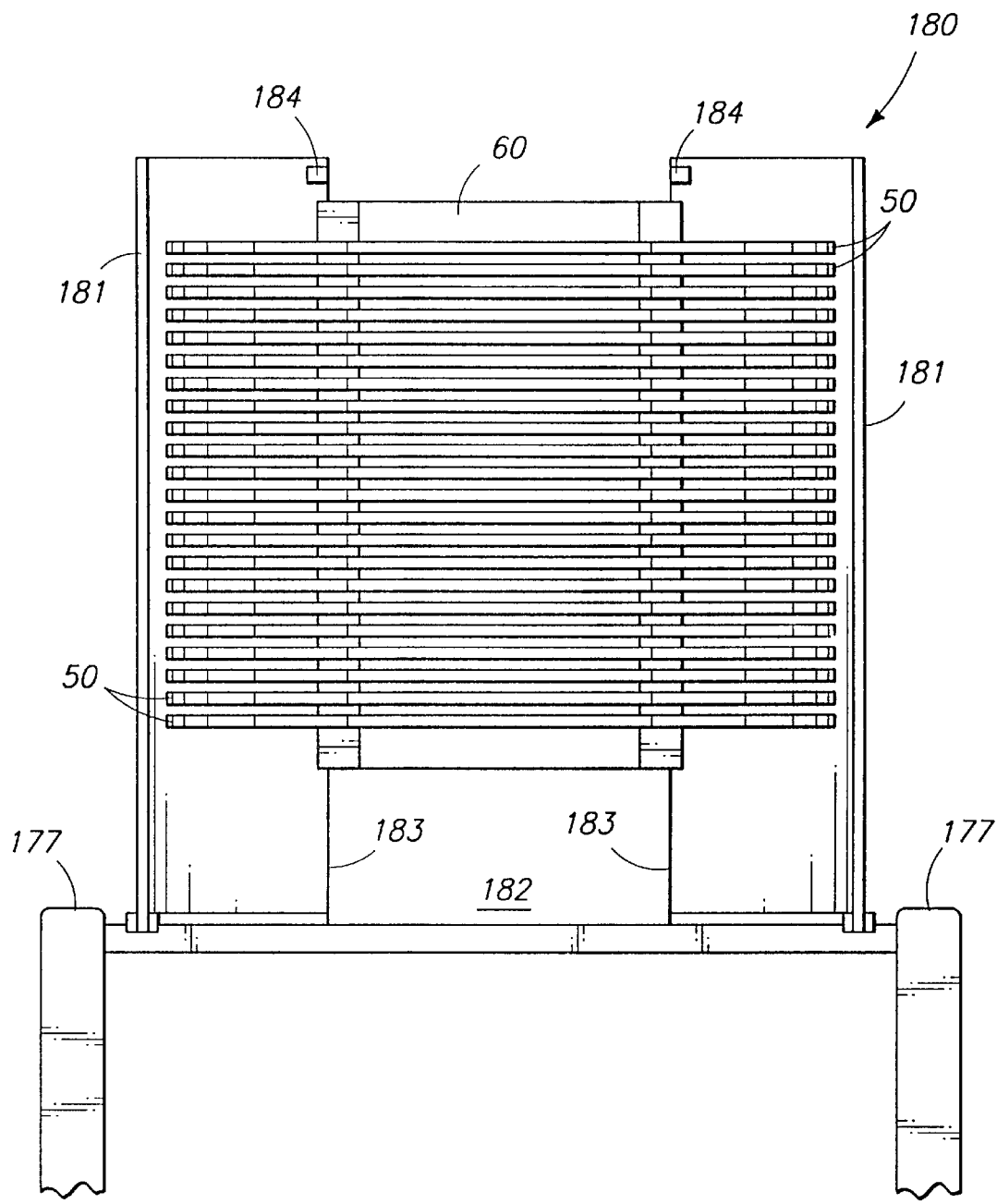
FIG. 29 is a top view showing a hand portion of the mechanical arm assembly with a tray of wafers loaded thereon.
Figure 30:
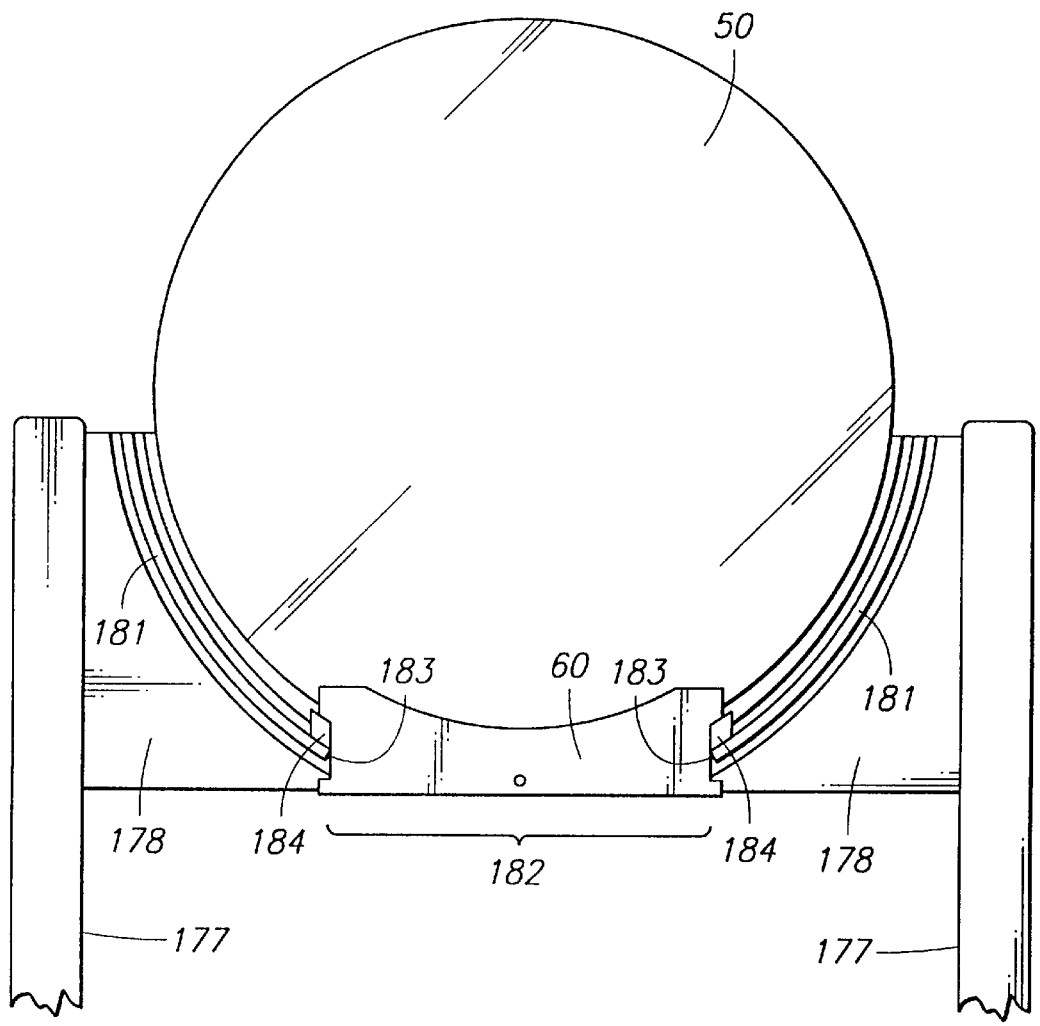
FIG. 30 is a front view showing the hand portion of FIG. 29.

FIGS. 29, 30 and 35 show that the preferred tray engagement tool 180 includes a complementary pair of hand extensions 181. Hand extensions 181 are advantageously semi-cylindrical sections which form a cradle which engages the wafer tray 60. The hand extensions preferably engage the wafer tray along the side rails, such as along the outer side surfaces of the tray. More specifically, the hand extensions preferably are spaced to define a hand extension gap 182 having parallel inside engagement edges 183. Tool engagement edges 183 are received along the wafer tray side channels 81. The tool engagement edges are slid longitudinally along side channels 81 to position the tool for engagement with the wafer tray.

The ends of the hand extensions are preferably provided with end tines 184. When the hand extensions are lifted upwardly, the engagement edges bear upon the downward facing bearing surface 82 of the wafer side channels. Simultaneously therewith, tines 184 move upwardly to latch at the end of the wafer tray to prevent longitudinal slippage of the wafer tray upon the hand extensions. This latching places the tines along end surfaces of the wafer tray. The hand extensions can advantageously be provided with perforations 185 (partially shown in phantom in FIG. 35) to lighten the weight of the assembly.

Figure 16:
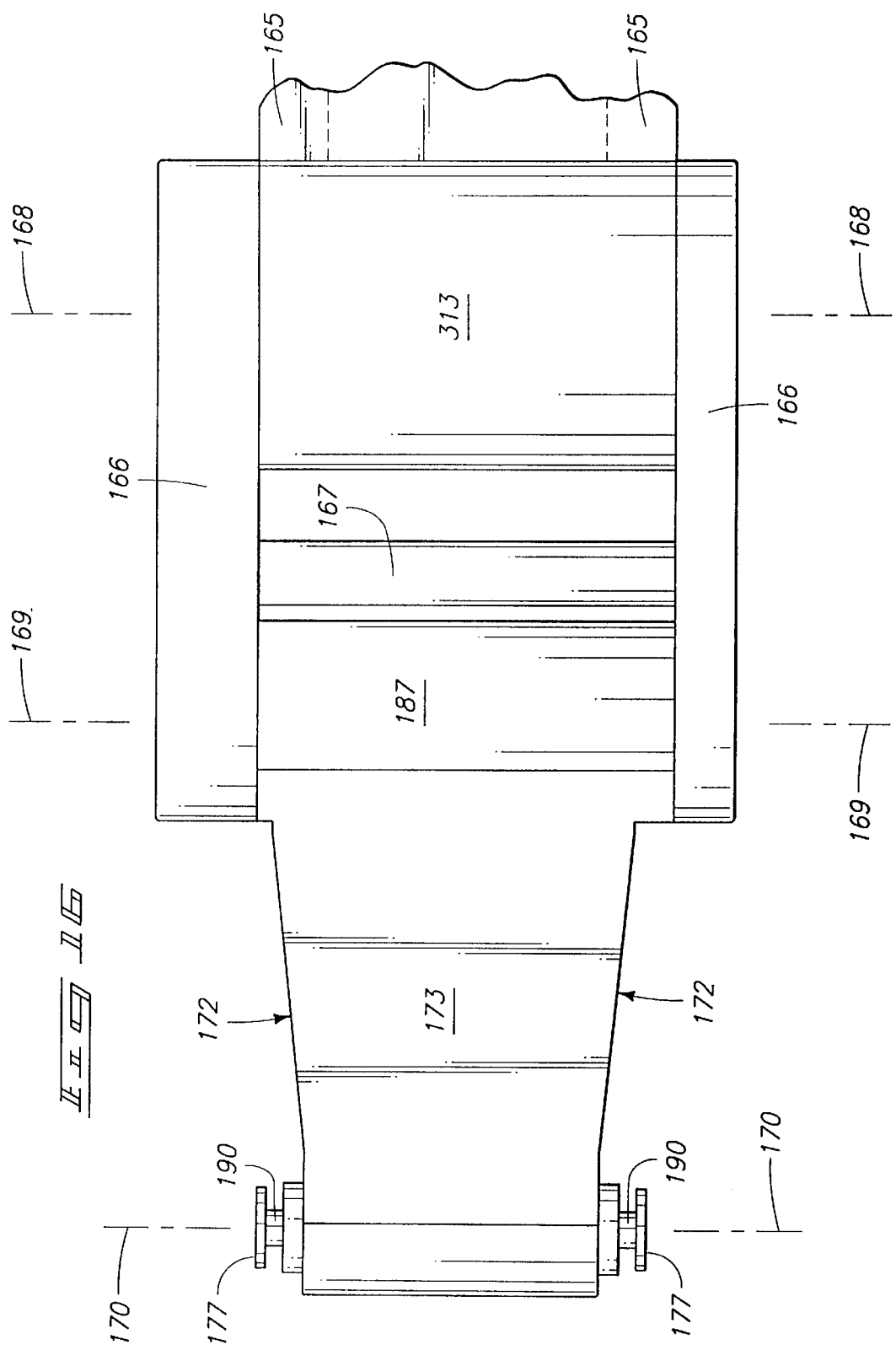
FIG. 16 is a view showing mechanical arm portions of the robot conveyor shown in FIG. 1 extended into a laid-out position for purposes of illustration.
Figure 17:
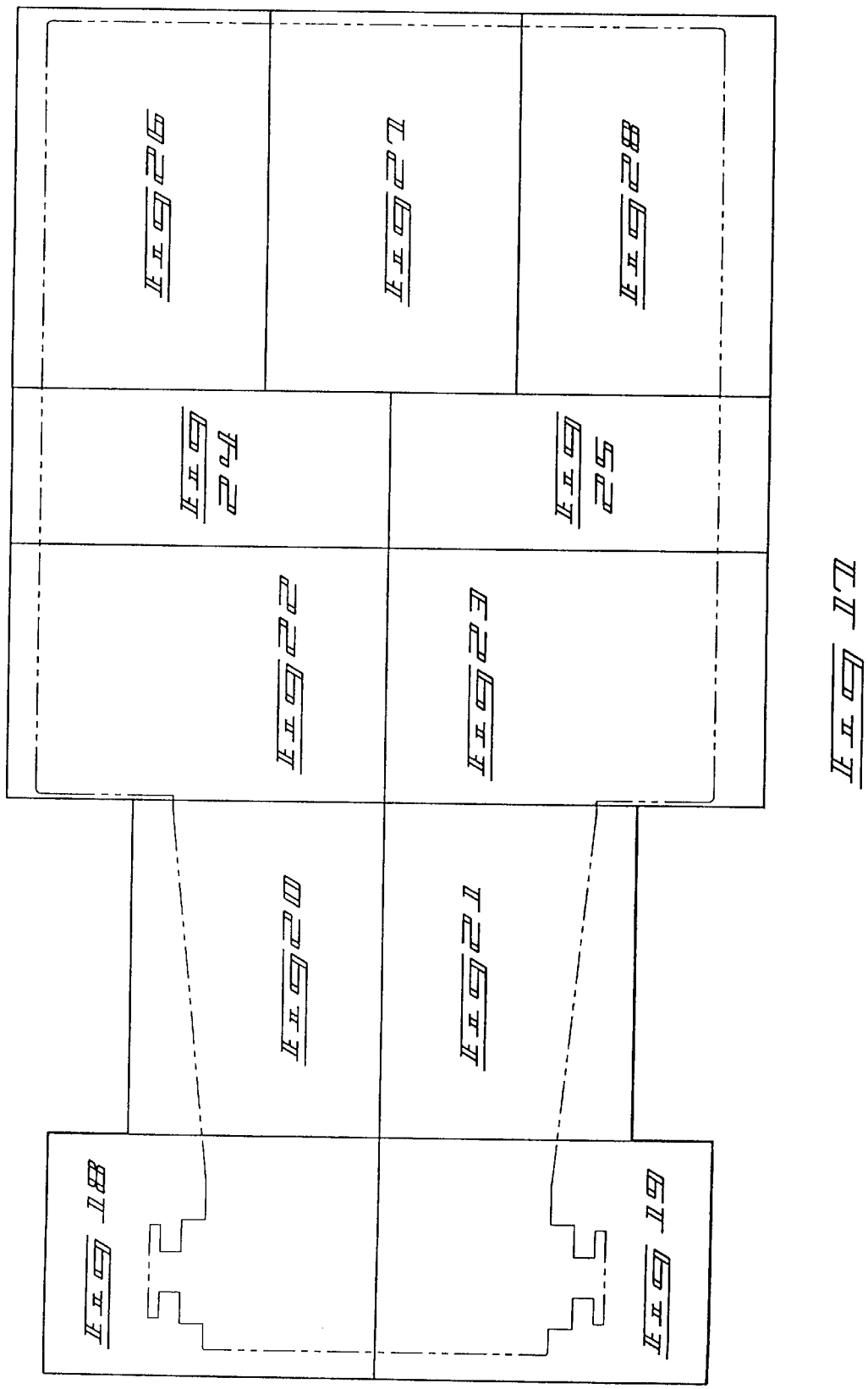
FIG. 17 is a view showing how the view shown in FIG. 16 is partitioned into the enlarged detail sectional views shown in FIGS. 18–28.

The preferred construction of mechanical arm assembly 157 will now be described in greater detail with reference to FIGS. 16–28 in addition to other Figs. of this application. FIG. 16 shows the mechanical arm assembly connected to tram base 160 using base pieces 165. A shoulder joint cover 313 is shown installed in FIG. 16. Similarly, an elbow joint cover 187 is shown installed about components of the elbow joint. Most of the hand assembly 176 is not included in FIG. 16 to simplify the drawing. FIG. 17 is similar to FIG. 16 except it shows how the mechanical arm 157 has been subdivided to allow enlargement and illustration of various details of the preferred construction. The detailed illustrations are sectional views presented in FIGS. 18–28.

Figure 18:
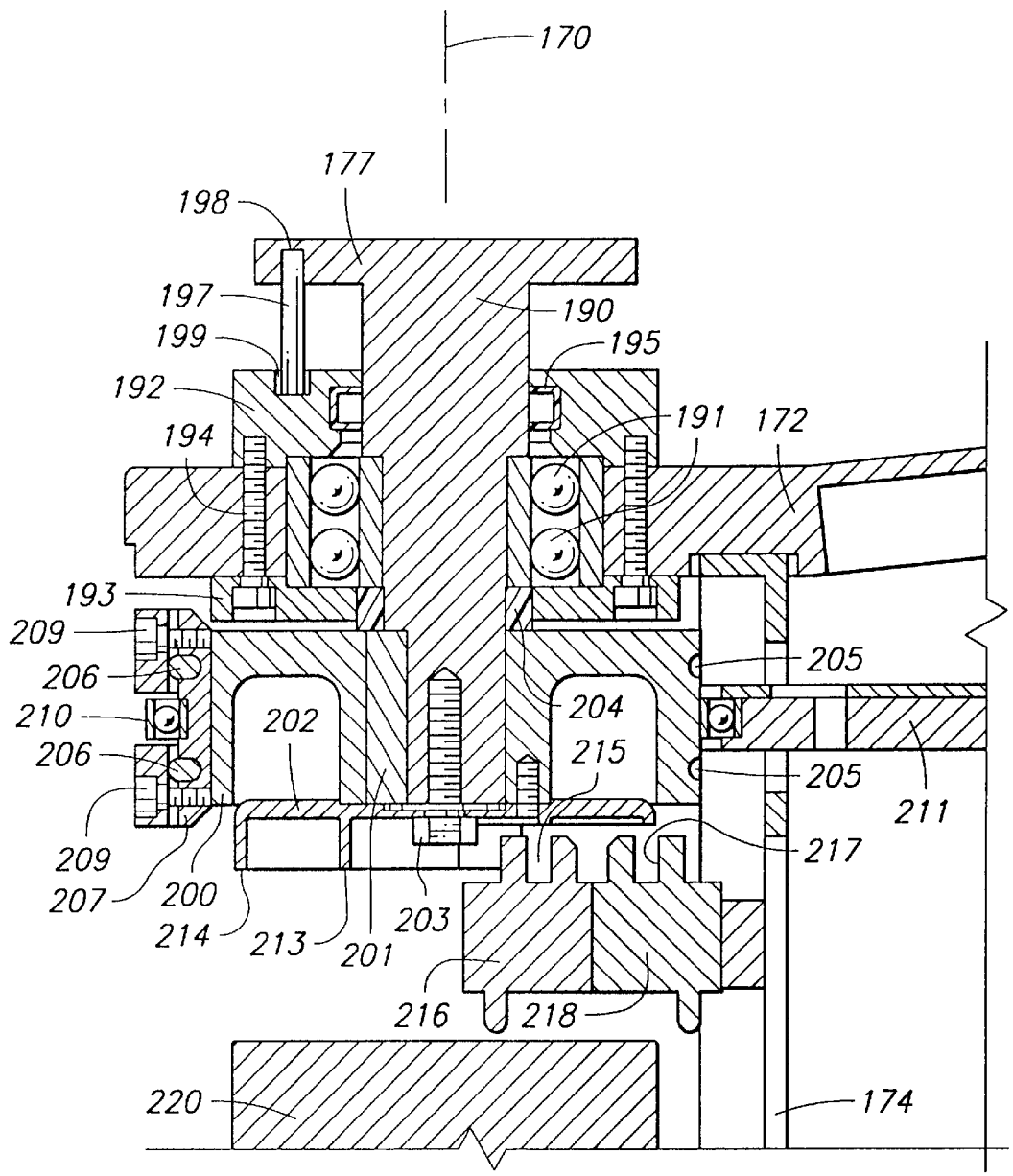
FIGS. 18–28 are enlarged detailed sectional views showing different portions of the mechanical arm of FIG. 16.
Figure 19:
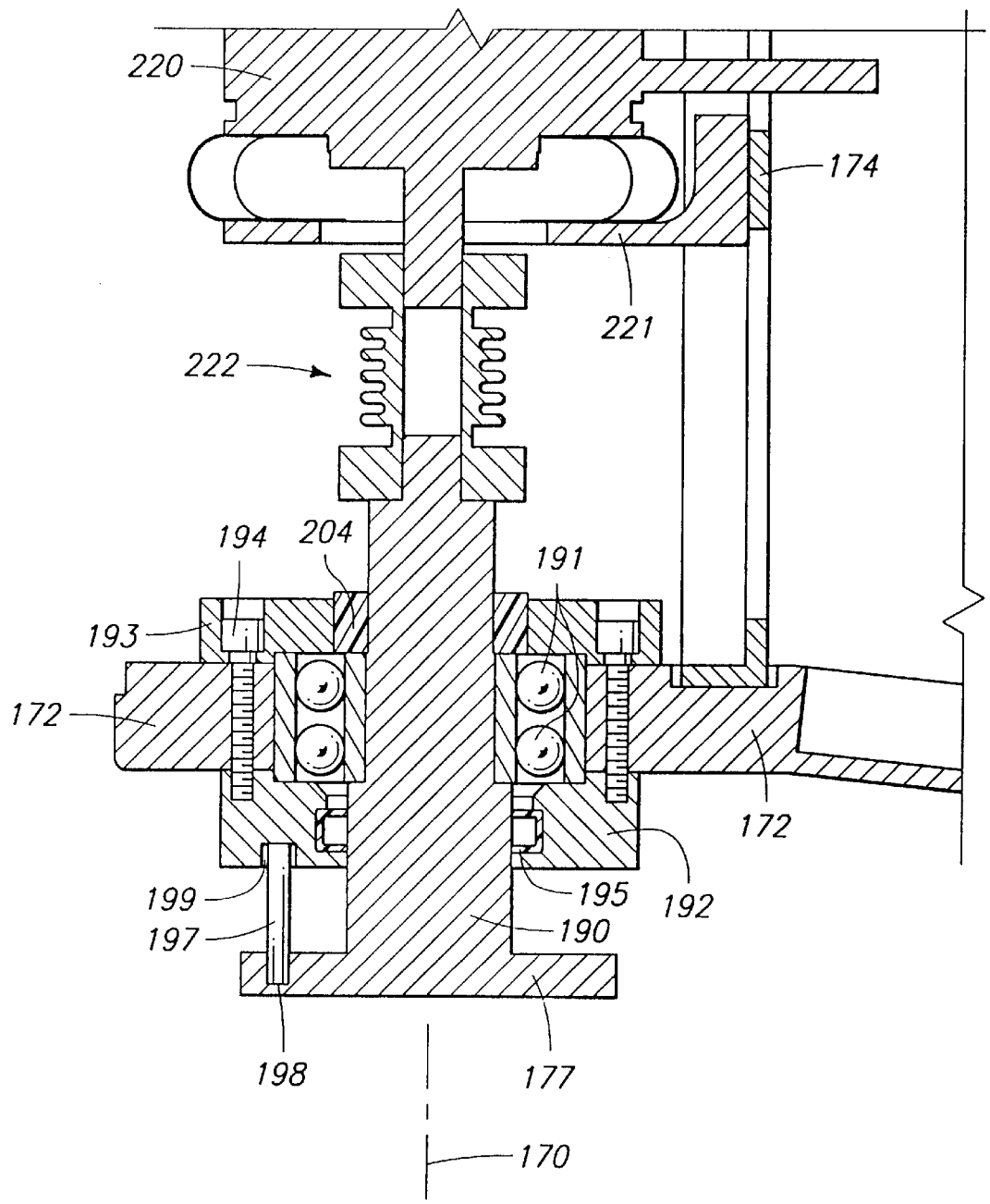
Figure 20:
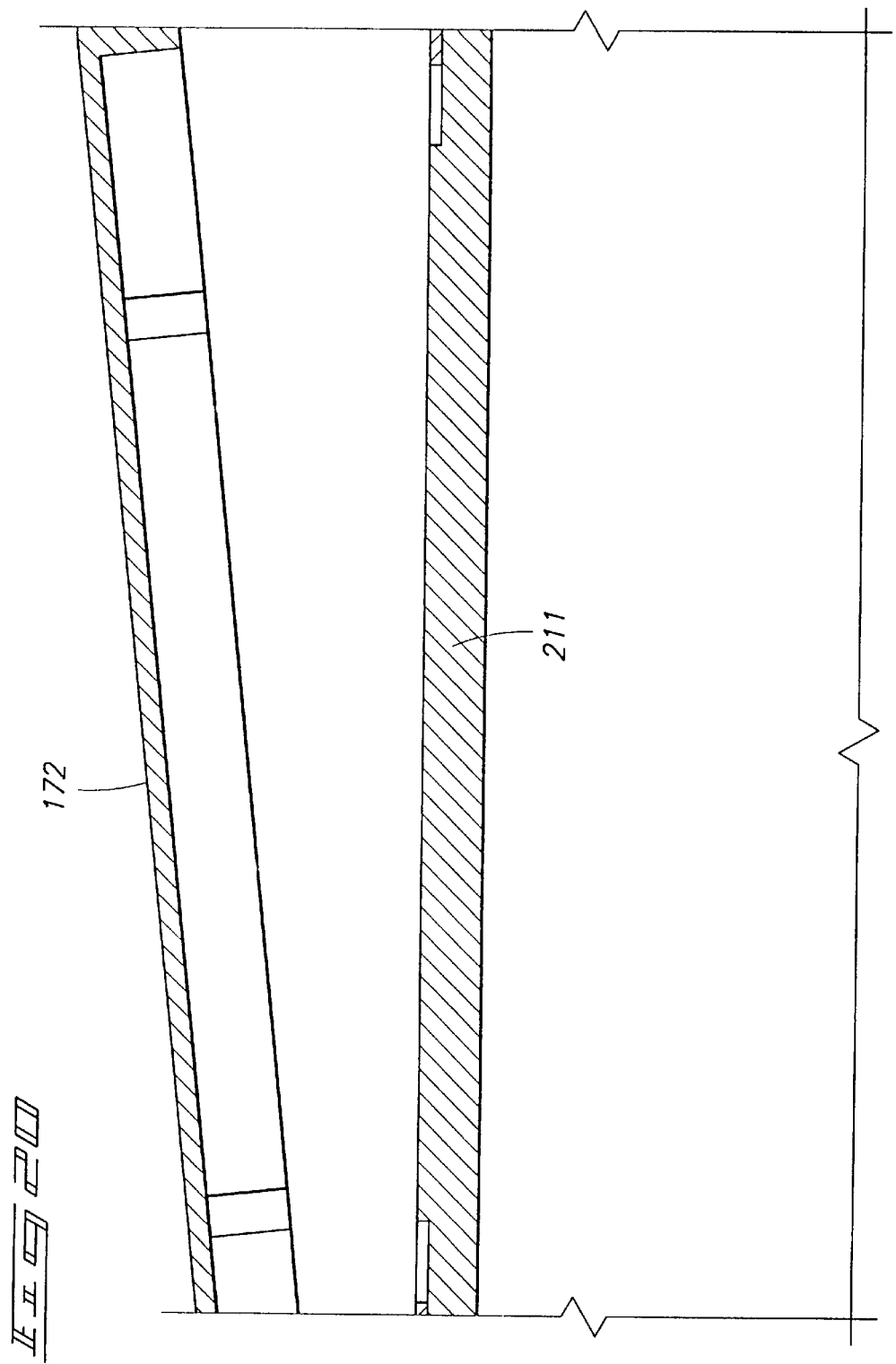
Figure 21:
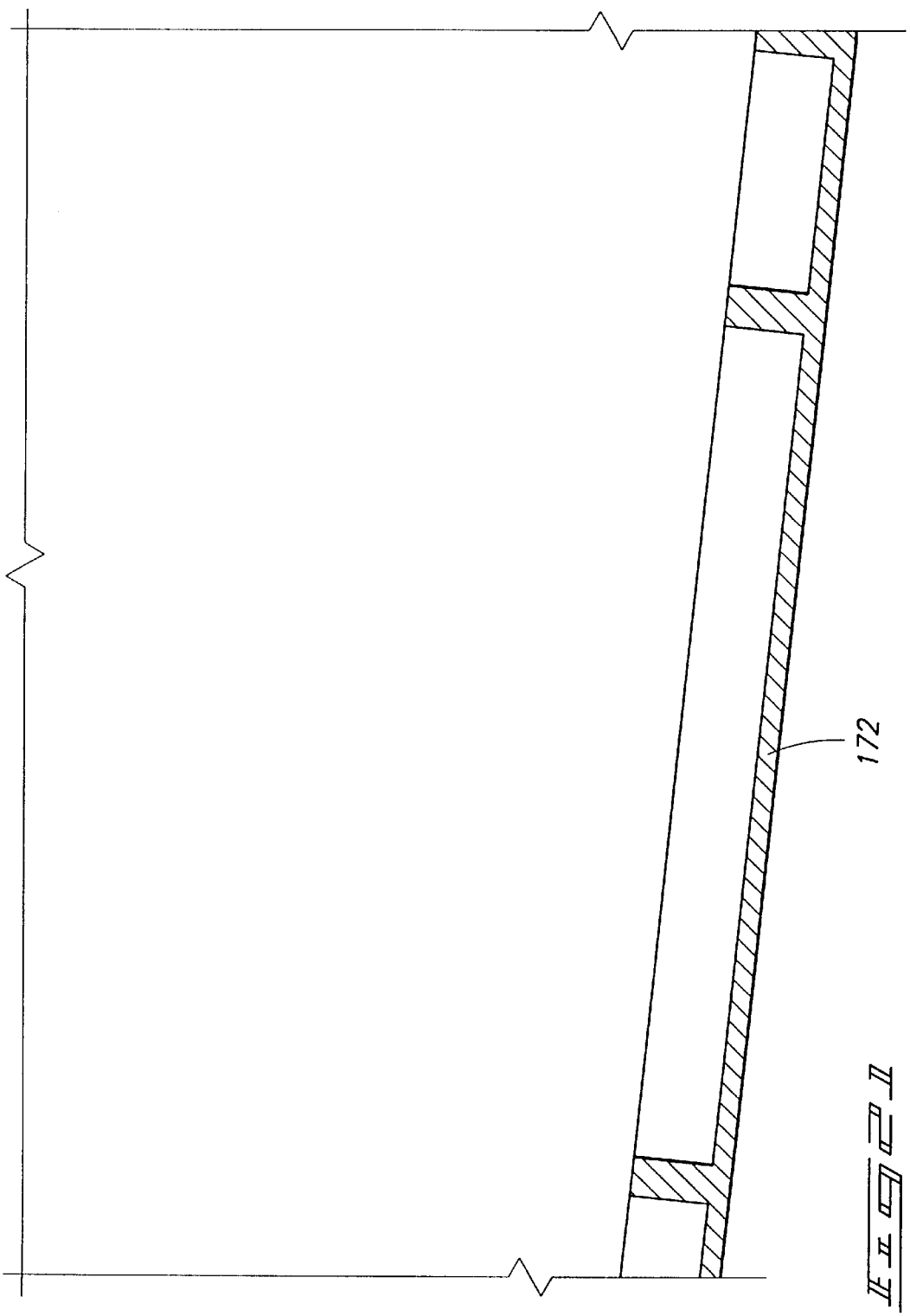

FIGS. 18 and 19 show components associated with the wrist joint connection between the hand assembly and the forearm assembly. The preferred wrist joint construction includes two hand connection hubs 190 which pivot to provide tilting action of the hand assembly. Hubs 190 are either integrally connected to the hand bars 177 (as shown), or detachably connected thereto. Hubs 190 are pivotally supported relative to the forearm members 172 using hand hub support bearings 191. Bearings 191 are supported by forearms 172 against radial movement, and against longitudinal movement by capture between an outboard seal housing 192 and an inboard bearing mounting ring 193. Fasteners 194 extend through ring 193, forearm 172, and into seal housing 192. Seal housing 192 holds a hub shaft seal 195.

Hubs 190 are limited within a defined range of angular motion using a wrist hub angular displacement limiter. The angular displacement limiter is advantageously in the form of an axial pin 197 which fits within a pin socket 198 formed in the hub 190. Pin 197 extends into an annular slot 199 formed in the outer face of the seal housing 192. The angular slot advantageously allows a range of motion of approximately 100–120° of arc.

The first hub 190 shown in FIG. 18 is connected to rotate with a hand drive pulley 200 using a shaft key 201 supported in associated keyways formed in the hub and pulley. A spacer ring 204 is between the inner race of bearing 191 and pulley 200. A pulley retainer 202 is fastened to the inboard end of the hub using a fastener 203 to keep the pulley against axial movement.

Pulley 200 has cable receiving grooves 205 formed in the periphery of the pulley. Hand drive cables 206 are received within the grooves 205. Pulley 200 is advantageously provided with a cable clamping block 207 which is set in the pulley within a recess. The cable clamping block has a clamp head 208 which squeezes down upon cables 206 when fasteners 209 are tightened.

Because of the need for highly accurate and repeatable positioning of the hand assembly, it has further been found desirable to provide independent bearing support for pulley 200. This can be accomplished using a pulley bearing 210. Pulley bearing 210 is supported by an intermediate spacer bar 211 which extends between the wrist joint and the elbow joint.

The pulley retainer 202 is advantageously formed with a pair of annular fins 213 and 214. Annular fin 213 can be moved into a position within detector gap 215 of optical detector 216. Similarly, annular fin 214 can be moved into a position within detector gap 217 of optical detector 218.

The optical detectors are mounted to the forearm cross member 174. Optical detectors 216 and 218 sense the outer bounds of desired angular travel of the hand assembly and serve effectively as limit switches providing signals to the controller operating the mechanical arm.

FIG. 19 shows that the second hub 190 is connected to an angular position encoder 220 which is mounted to cross member 174 using an encoder mount 221. The shaft of the position encoder is coupled to hub 190 using a bellows shaft coupling 222. Movements of the hand assembly relative to forearms 172 are detected with greater precision by encoder 220. A preferred encoder discriminates a 360° circle into approximately 64,000 divisions.

Figure 22:
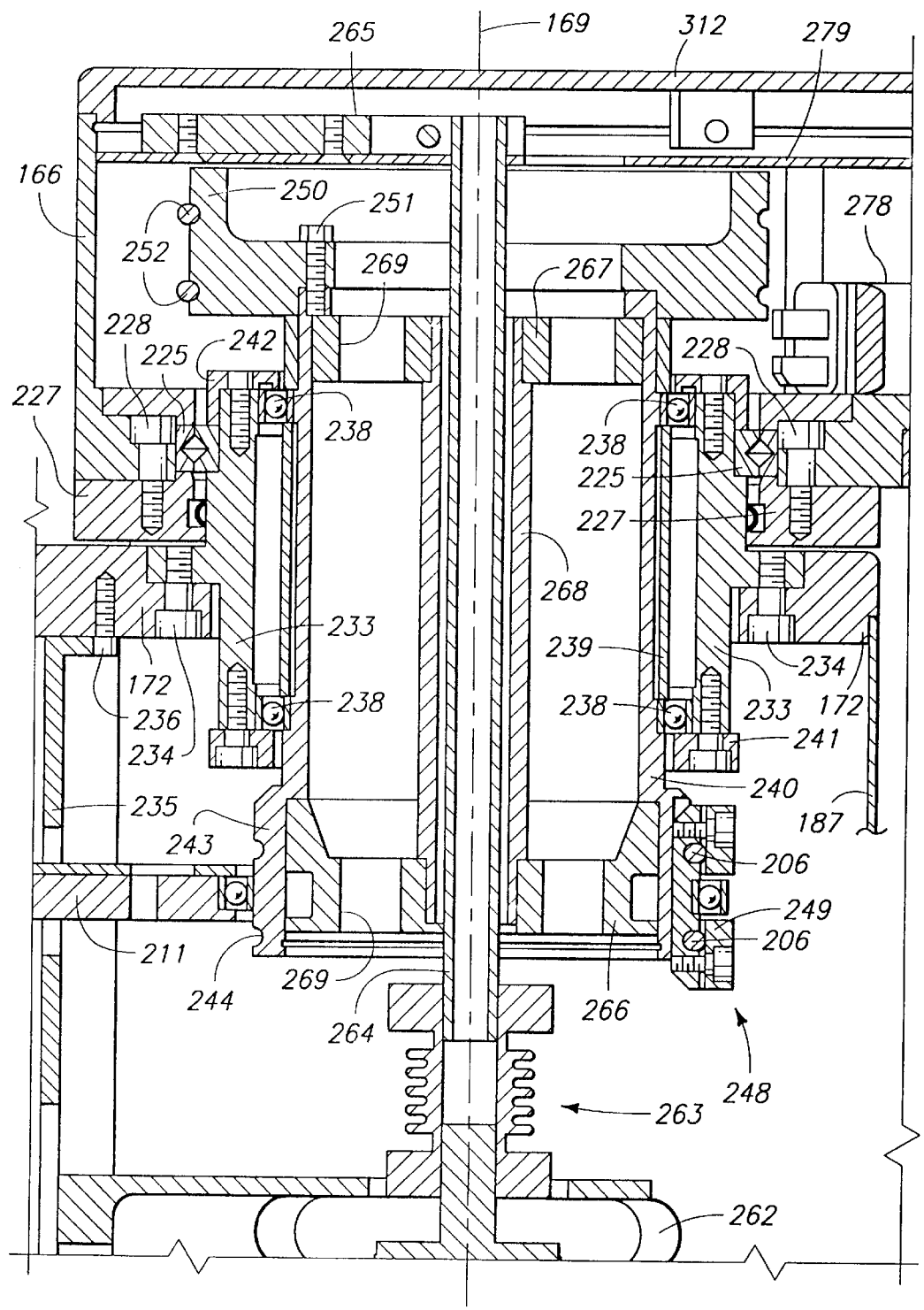
Figure 23:
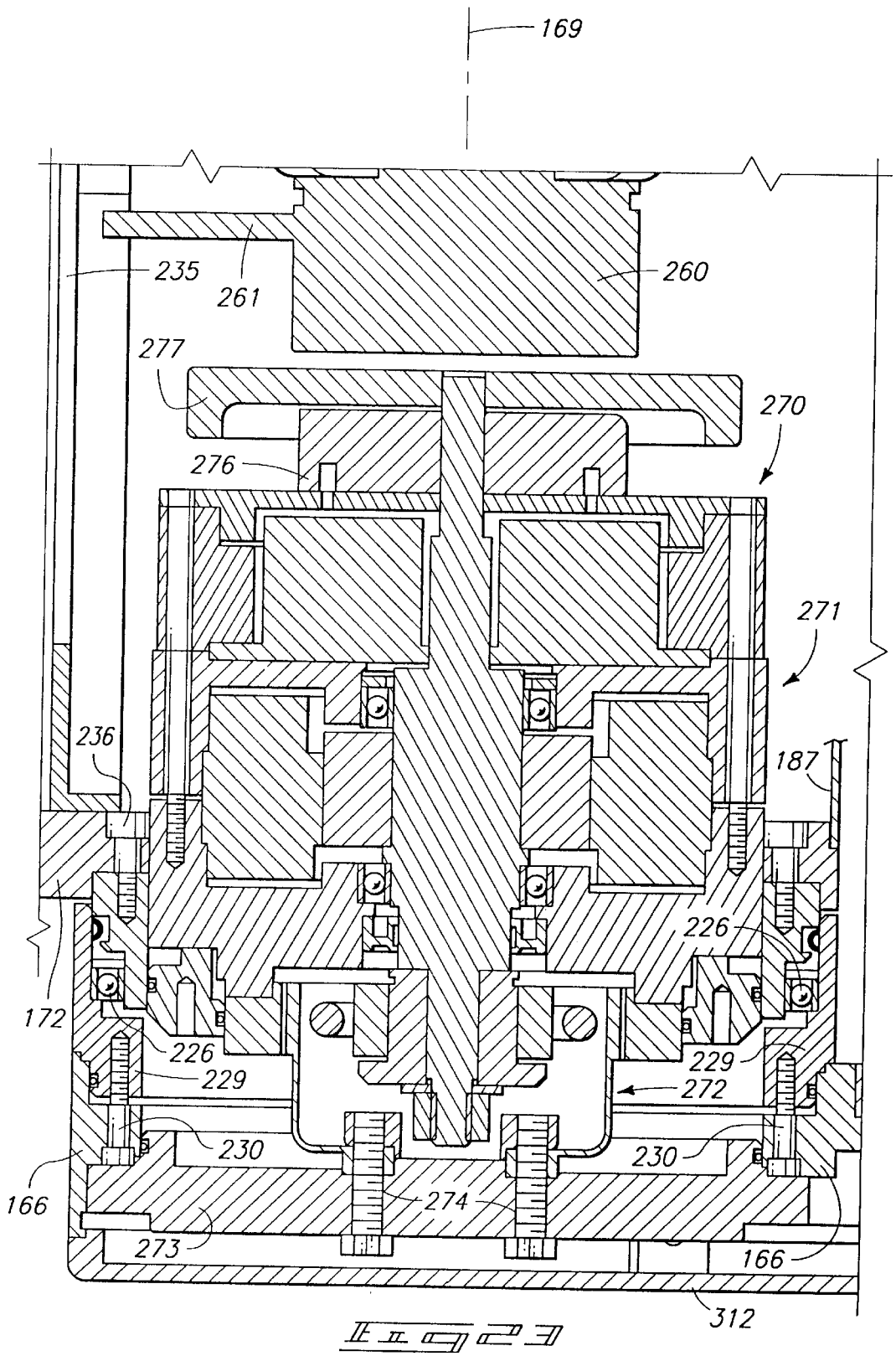
Figure 24:
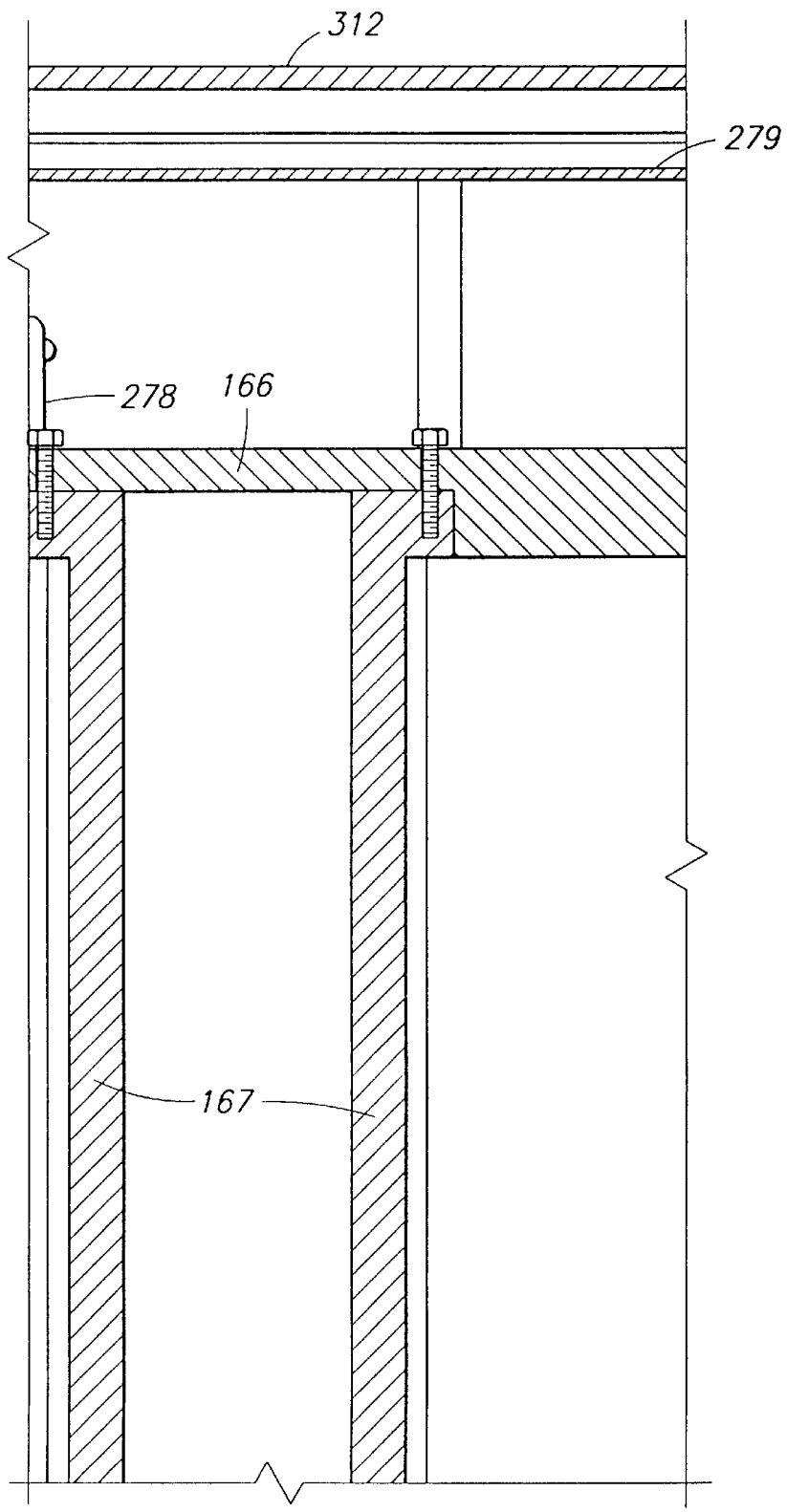
Figure 25:
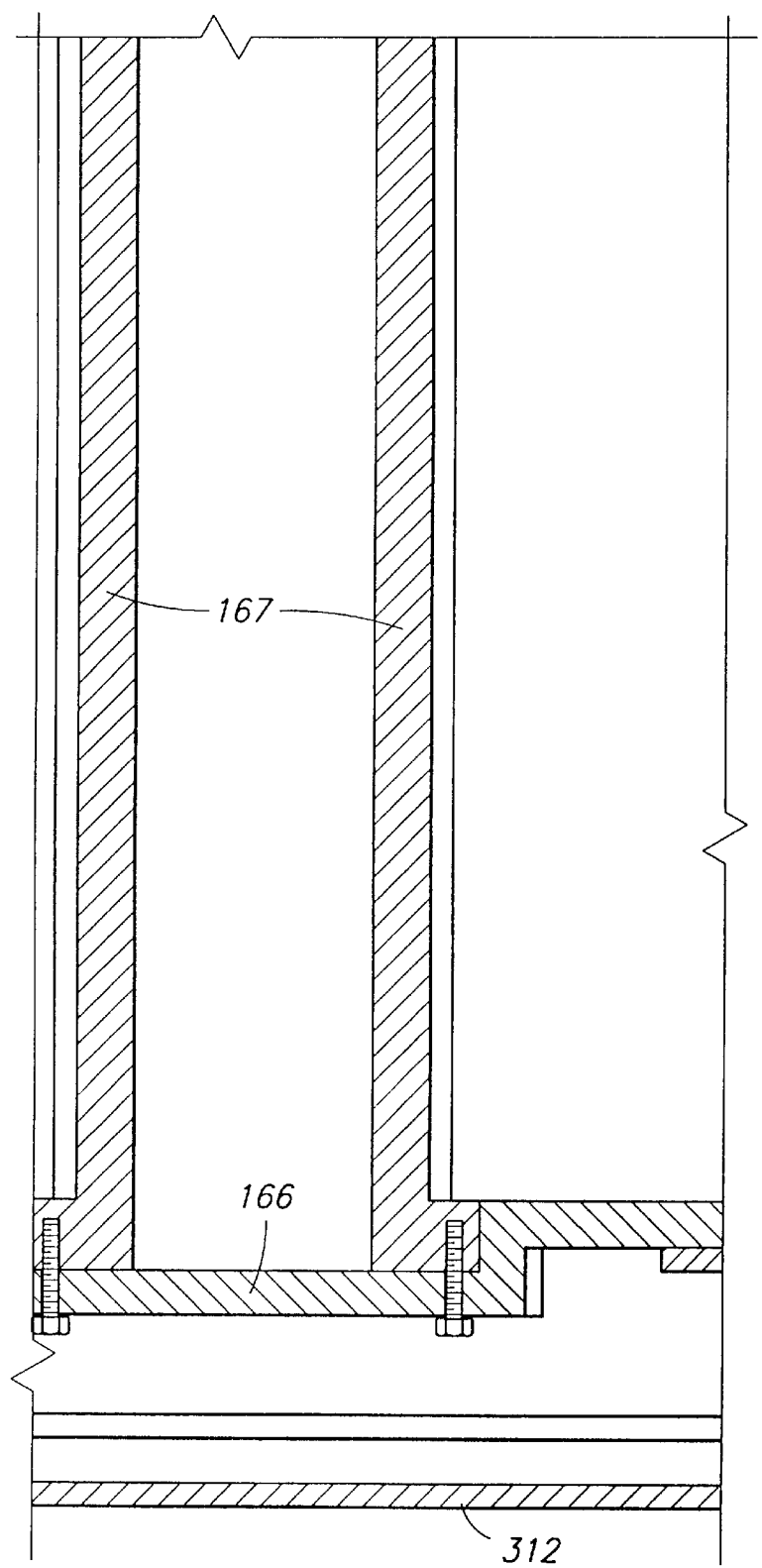

FIGS. 22 and 23 show the elbow joint between forearms 172 and upper arms 166. The elbow joint pivots about elbow joint axis 169. Pivotal action between the upper arm assembly and forearm assembly is accommodated by two main elbow pivot bearings 225 and 226. First main elbow pivot bearing 225 is preferably a cross roller thrust bearing. Second main elbow pivot bearing 226 is preferably a ball bearing. The outer race of first main bearing 225 is connected to the upper arm 166 using a bearing support ring 227 and fasteners 228 which extend through apertures in upper arm 166. A similarly functioning bearing support ring 229 and fasteners 230 are used in connecting second bearing 226 to upper arm 166.

Bearing 225 receives within its inner race a forearm mounting tube 233. Forearm 172 is secured to mounting tube 233 using fasteners 234. A proximate forearm cross brace 235 extends between and is connected to forearms 172 using fasteners 236. Mounting tube 233 is used to pivotally support a cable drive transfer shaft 240. Cable drive transfer shaft 240 is supported within mounting tube 233 using a pair of transfer shaft bearings 238. A tubular bearing spacer 239 extends between the inner races. Bearing retainer rings 241 and 242 are fastened to hold the bearings axially against the mounting tube 233.

The inboard end of transfer shaft 240 is advantageously formed as an elbow joint transfer pulley 243. Elbow joint transfer pulley 243 has parallel cable receiving grooves 244 and a cable mounting block 248 similar to wrist joint pulley 200. The cable mounting block 248 has a cable mount head 249 fastened to the pulley to secure cables 206. Cables 206 extend between pulleys 243 and 200 to effect movement of pulley 200 and the hand assembly.

Inboard transfer pulley 243 is driven by an outboard transfer pulley 250. Pulley 250 is fastened to transfer shaft 240 using fasteners 251. Cables 252 are looped around pulley 250 and hand drive transmission output pulley 255 at the shoulder pivot (see FIG. 26). Pulley 255 is driven by a hand drive electrical motor 256. The output of motor 256 is coupled to pulley 255 via a harmonic drive speed reduction transmission 257. The frame of motor 256 is held securely to the base 165 of the mechanical arm. The reduced speed output from the harmonic drive controls the tilt of the hand assembly. This construction allows the tilt of hand assembly 176 to stay at a fixed attitude even though the upper and lower arms pivot. Thus the attitude of the hand assembly only changes when the hand drive motor 256 is controlled to drive.

FIGS. 22 and 23 also show an elbow joint encoder 260. The casing of the encoder is mounted to the forearm assembly cross member 235 using an encoder mount 261. Encoder mount 261 includes an isolation mount band 262 to reduce vibratory transmission to the encoder. The shaft of the encoder is connected through a bellows coupling 263 to an upper arm encoder coupling shaft 264. The outboard end of shaft 264 is fixed to the upper arm 166 using a coupling shaft mount 265. Relative angular motion between the upper arm and the forearm is detected as relative angular motion between the encoder case and encoder shaft. This information is provided to the controller used to control mechanical arm 157. A partition plate 279 extends from mount 265 to help guide wiring (not shown).

Between encoder coupling shaft 264 and the tubular transfer shaft 240 is an assembly advantageously used to guide electrical wires. The transfer tube wire guide includes an inboard part 266, an outboard part 267, and an intermediate tubular member 268. Inboard and outboard parts 266 and 267 have passageway apertures 269 through which wires are run.

FIG. 23 shows the forearm drive assembly 270. Drive assembly 270 includes a forearm drive motor 271 and a forearm drive speed reduction transmission 272. The outer housing of motor 271 is coupled to the forearm assembly. The shaft of motor 271 is connected to the transmission 272 which is preferably a harmonic drive providing 160:1 gear reduction. The third connection of the harmonic drive is coupled to the upper arm assembly via a harmonic drive coupling plate 273 using fasteners 274. The opposite, inboard, end of motor 271 is provided with a motor encoder 276 which indicates operation of the forearm motor 271 and provides a signal indicative thereof. A thumb wheel 277 is also advantageous provided to allow manual movement of the motor during maintenance and setup.

The elbow joint is also advantageously provided with an elbow joint limit switch 278 which is tripped when the relative position of the forearm reaches the limits of desired angular travel.

Figure 26:
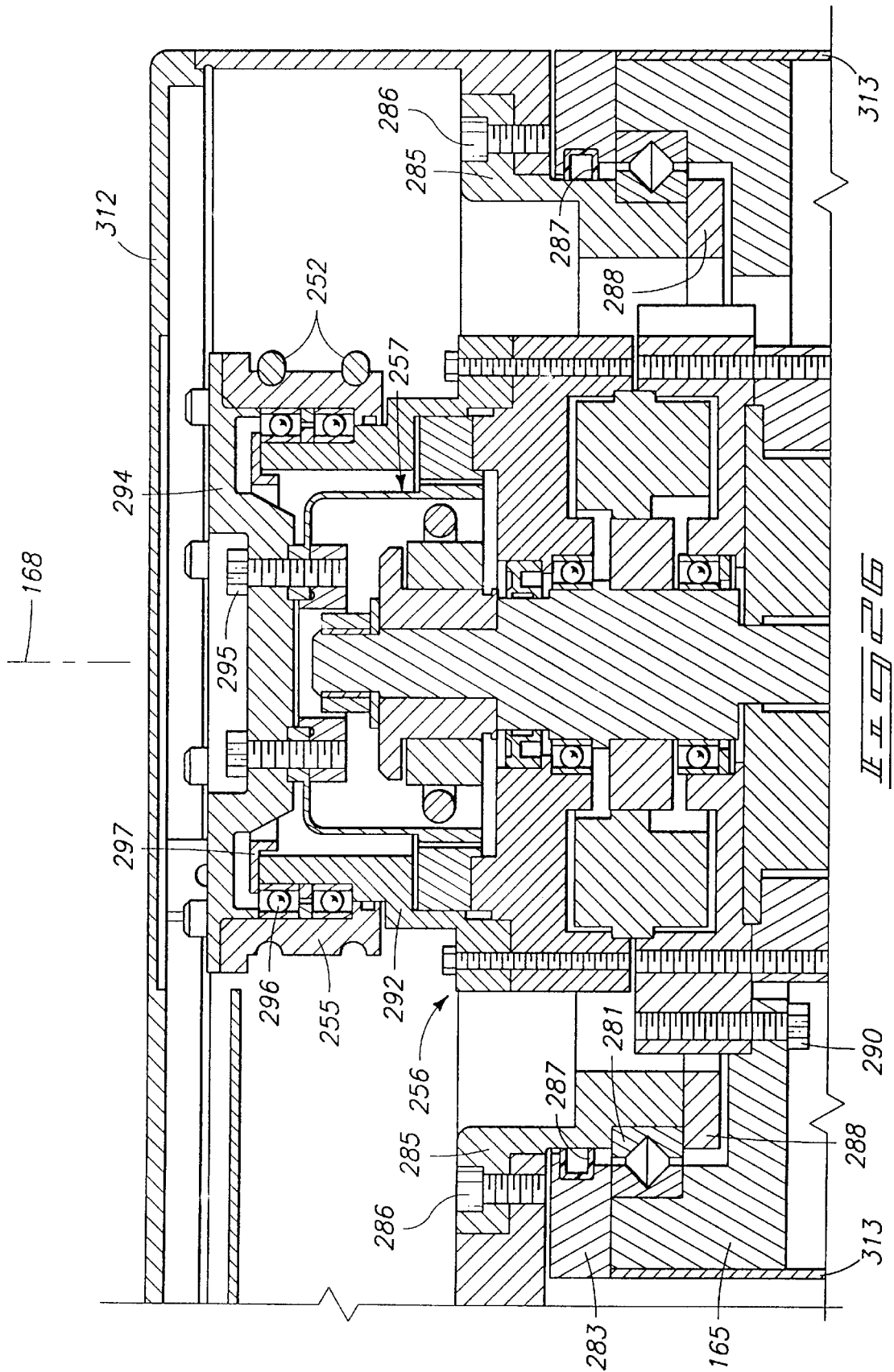
Figure 27:
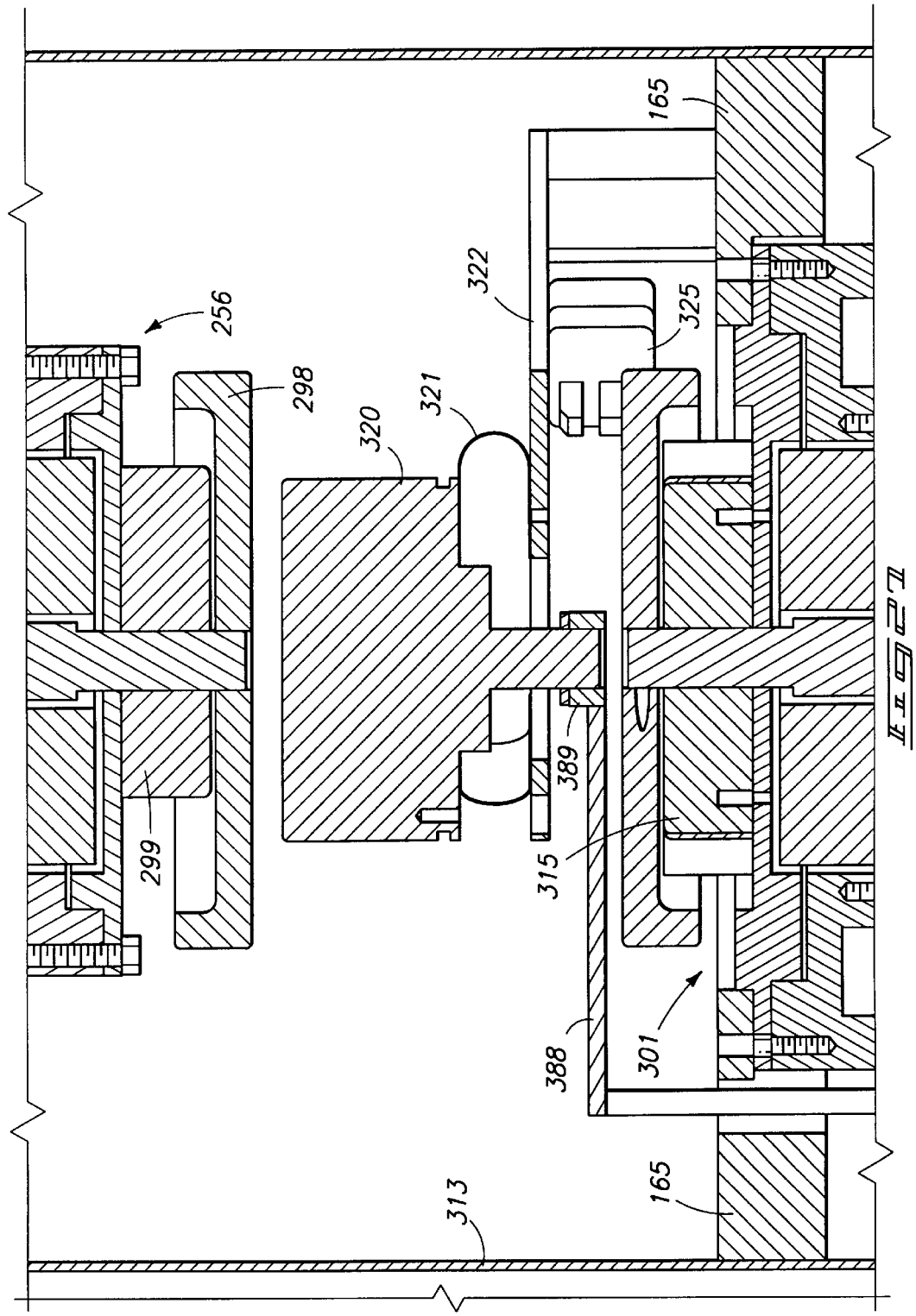
Figure 28:
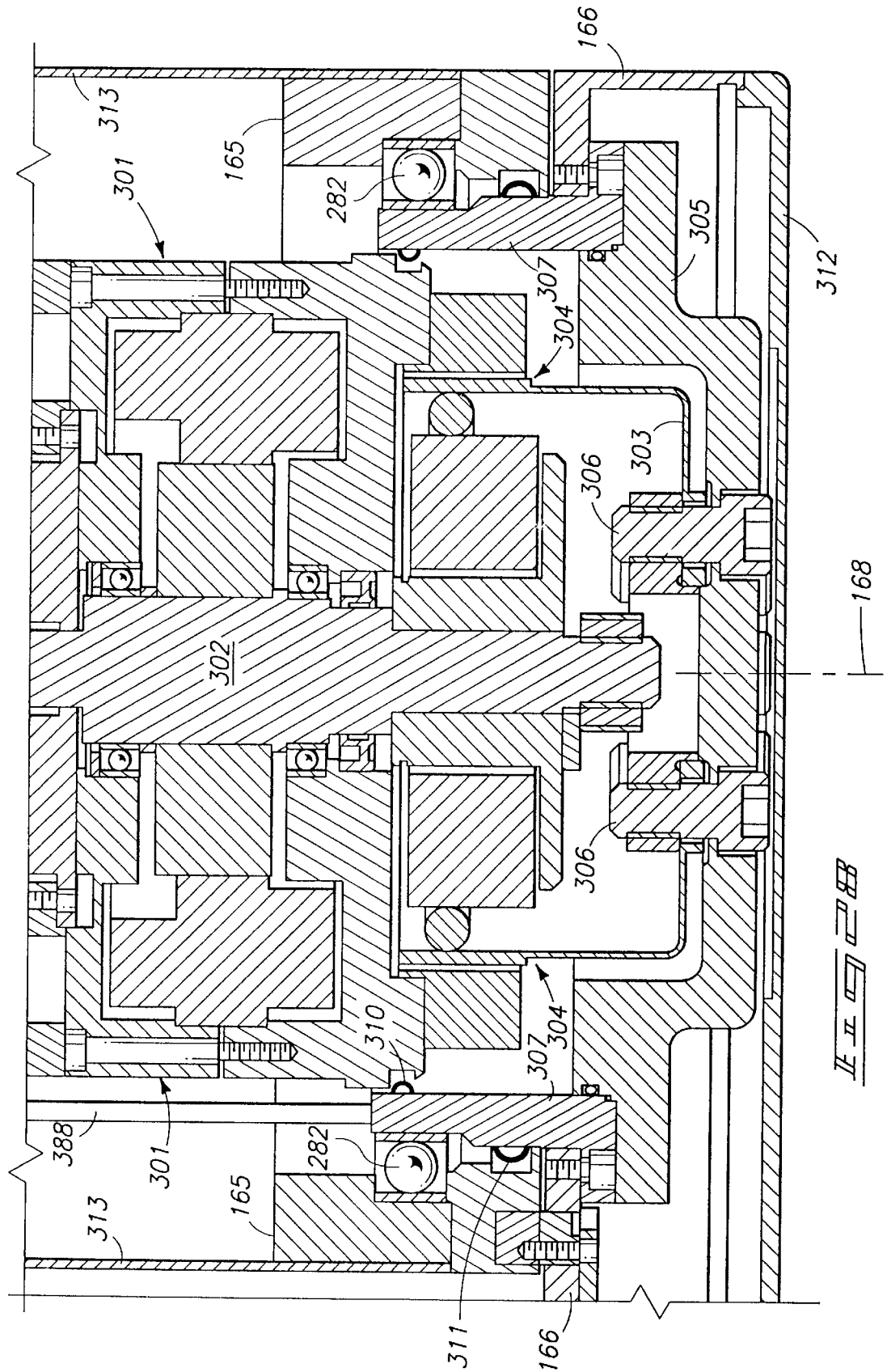

FIGS. 26–28 show the shoulder joint which pivots about pivot axis 168. The shoulder joint provides for relative pivotal motion between the base pieces 165 and the upper arm assembly. Base pieces 165 are secured to tram carriage 160. Relative angular movement between base pieces 165 and the upper arms 166 is supported by main shoulder pivot bearings 281 and 282. First main bearing 281 is advantageously a cross roller thrust bearing. Second main bearing 282 is advantageously a ball bearing.

The outer race of bearing 281 is secured to the base piece 165 using a bearing retainer 283 which is fastened to base 165. The inner race of bearing 281 is coupled to an upper arm coupling ring 285. Coupling ring 285 is secured to the upper arm 166 using fasteners 286. A seal 287 is advantageous positioned between bearing retainer 283 and coupling ring 285. An inner race bearing retainer ring 288 is fastened to coupling ring using fasteners (not shown).

The housing of the hand drive motor 256 is mounted to the base piece 165 using bolts 290. The shaft 291 of motor 256 is connected to the harmonic drive transmission 257. The casing of the harmonic drive is captured between a pulley mounting ring 292 and the housing of motor 256. This fixes the position of the harmonic drive casing. The third or output connection of the harmonic drive is connected to a pulley drive piece 294 using fasteners 295. The pulley drive piece transmits torque from the output of the harmonic drive to hand motor pulley 255.

Pulley 255 is supported for pivotal movement upon mounting ring 292 using bearings 296. Bearing 296 are held in axial position by a bearing retainer 297 fastened to mounting ring 292 by fasteners (not shown). The inboard end of motor shaft 291 is advantageously fitted with a thumb wheel 298 for manual manipulation of the motor during setup and maintenance. A motor encoder 299 is connected with motor 256 to provide motor response information to the mechanical arm controller which is used along with information from the hand angular position encoder 220 to provide precise control of the mechanical arm assembly.

FIGS. 27 and 28 show the drive used to move the upper arm assembly relative to base pieces 165. The upper arm assembly drive includes an upper arm drive motor 301. Motor 301 has a shaft 302 which drives a harmonic drive speed reduction transmission 304. The casing of the harmonic drive is coupled securely to the housing of motor 301, both of which are secured to base pieces 165. The flexible spline or third output 303 of the harmonic drive is coupled to an upper arm drive piece 305 using fasteners 306. Drive piece 305 is connected to an upper arm bearing ring 307 which is held by the second main bearing 282. This allows the bearing ring 307 and attached upper arm pieces to pivot. Seals 310 and 311 are advantageously included to seal the enclosed motor and transmission space to reduce contamination within the working space of the processor.

The inboard end of motor 301 is provided with a motor encoder 315 and a thumb wheel 316. An upper arm drive position encoder 320 is mounted with an isolation connector 321 to a support or mount 322 which is connected to base ring 165. The shaft of the encoder is connected by a clamp 389 to an arm 388. Arm 388 connects to piece 307 to indicate angular movement of the upper arm. A limit switch 325 is positioned to trip when the upper arm assembly extends to the limits of its desired angular travel range.

Upper arms 166 are also preferably provided with outer cover pieces 312 to enclose components of the upper arm assembly. The base is provided with a base cover cylinder 313 to partially confine and facilitate enclosing the internal space which holds includes the motors and transmissions.

Control System

Figure 34:
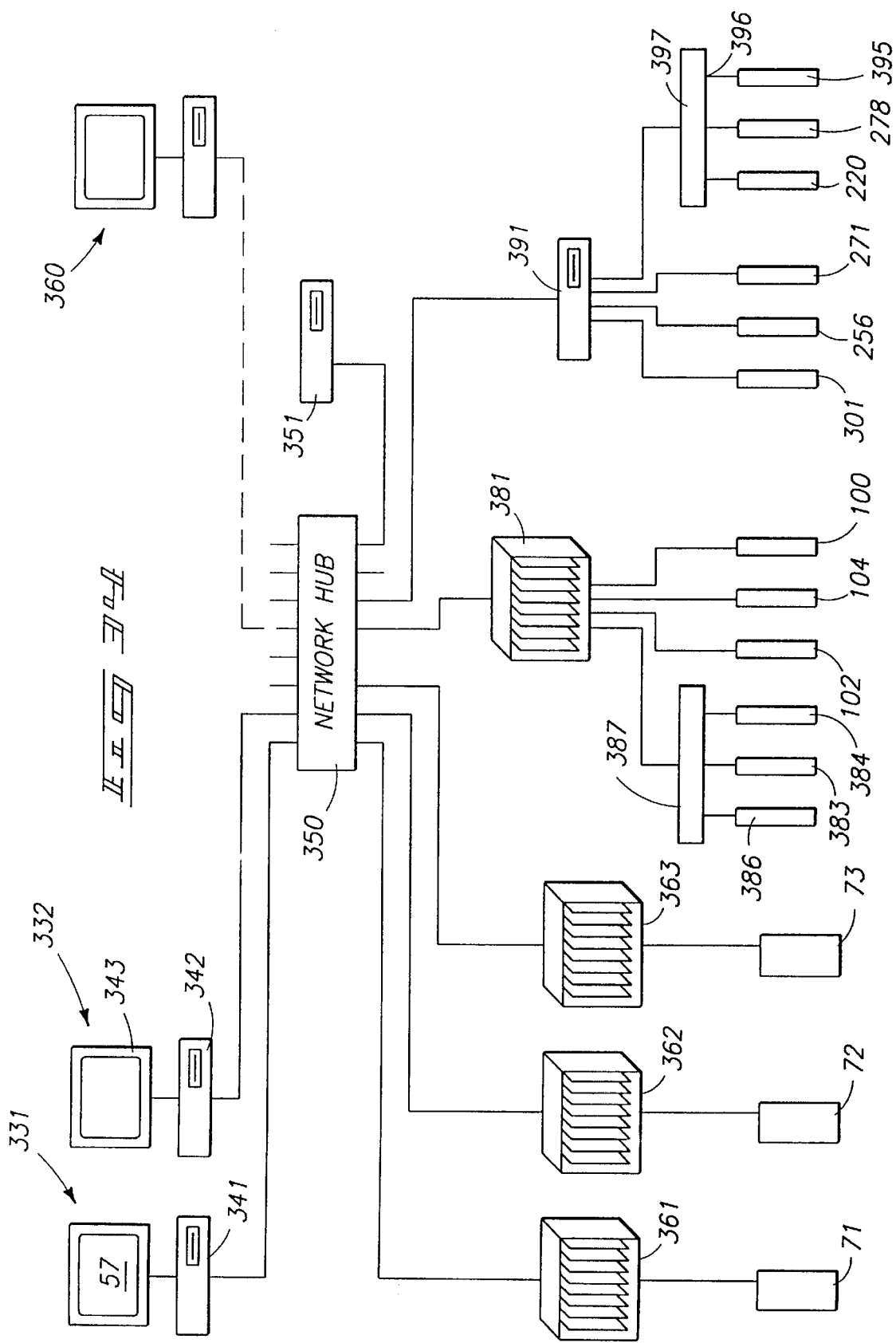
FIG. 34 is a schematic view showing functional blocks of the preferred control system used in the processor of FIG. 1.

FIG. 34 shows a preferred control system used in processor 40. The control system advantageously uses a modular design which incorporate commercially available computer modules, such as 80486 based computers, to perform various functions. FIG. 34 shows the human operator interaction stations 331 and 332. The first station 331 has a computer processor 341 of conventional design and an electrically attached display and control panel 57. Control and display panel 57 is accessible from the front or clean room side of processor 40. The second control station 332 has a computer processor 342 also of conventional design and an electrically attached display and control panel 343 which is available for operation on the gray room or back side of processor 40. Both control stations are connected using a standard network interface hub 350. Network hub 350 is connected to a central controller, such as a computer file server 351. Hub 350 can also be used to connect an outside control or monitoring station 360 for additional control capabilities, data acquisition, or monitoring of processing and control functions.

Hub 350 is further connected to processor control modules 361–363, which are also conventional computers without displays. Processor station control modules 361–363 are each associated with processing stations 71–73 respectively. These station control modules allow independent processing routines to be run at the processing stations and for data to be recorded indicating the processing performed in each particular batch being run by each processing station.

Processing station control modules are connected to and interact with the processing station motors, plumbing, etc which are collectively identified with the processing station number 71–73 in FIG. 34.

FIG. 34 further shows an interface subsystem controller 381, which again is a computer. Interface subsystem controller 381 is electrically connected to various features of the interface subsystem to both control operation and receive confirmatory signals of movements and positions. The interface controller 381 is preferably connected to the interface section to receive signals through a number of optical fibers 386 used to convey signals from positional encoders for the first and second carriages 382, limit switches 383 which detect the limit of travel of the carriages and elevators, and wafer detectors 384 which detect wafer trays and wafer carriages held in the interface section. The system is preferably constructed so that most or all sensed signals used in the control and operation of the interface are communicated by optical fiber to eliminate the risk of cross talk between signal lines. The optical fiber transmitted signals are converted into electronic signals by an optical fiber signal converter 387 which produces electronic signals which are communicated to computer 381.

FIG. 34 still further shows a conveyor control module in the form of a computer 391 without display which is electrically connected to various parts of the conveyor, such as the mechanical arm motors 256, 271 and 301, encoder 220, and other components thereof not specifically illustrated.

The conveyor control module also preferably receives a number of signals through optical fibers 396. Optical fibers 396 are used to convey signals from angular position encoders and motor encoders for the conveyor 140 which are for simplicity exemplified by encoder 220 in FIG. 34. Limit switches for the conveyor are exemplified by limit switch 278 in FIG. 34. Hall effect sensors 395 are used in sensing operation of the motors of the conveyor. The system is preferably constructed so that all sensed signals used in the control and operation of the conveyor are communicated by optical fiber to eliminate the risk of cross talk between signal lines and provide a smaller cable bundle which is moved in connection with tram motion up and down the track. The optical fiber transmitted signals are converted into electronic signals by an optical fiber signal converter 397 which is connected to reconvey the signals to computer 391.

Alternative Configurations

FIG. 36 shows an alternative configuration of processor 400 constructed and capable of operation according to this invention. Processor 400 includes two interface sections 401 and 402, which are advantageously mounted upon opposing ends of the processing system. Interface sections 401 and 402 are substantially or identically the same as interface section 43 described above. Between the interface sections are a series of processing stations 411–415. Stations 411–413 and 415 are similar to centrifugal processing stations 71–73. Processing station 414 is of an alternative design which will be more fully described below. Other alternative constructions are also possible.

Processor 400 has a processing enclosure 430 which in part defines an interior working space 431 adjacent to the processing stations and including the interface spaces accessible to the wafers being processed.

Processor 400 can be operated to load wafer carriers at first interface station 401 and remove processed wafers in wafer carriers at second interface station 402. Alternatively, each interface station can both load and return processed wafers through their associated interface ports.

The alternative wafer submersion processing station 414 is shown in greater detail in FIGS. 37–39. Submersion or immersion processing station 414 includes two processing bath or immersion tanks 501 and 502 which are in front and back, respectively. Tanks 501 and 502 are used to hold processing liquids, such as acids and water. Tanks 501 and 502 advantageously have enlarged brims 513. Station 414 includes a frame extension 505 which is a vertical member which mounts a wafer tray dipping mechanism or dipper 507.

Dipper 507 includes a movable dipper arm 508 which moves within a channel 504 using a dipper drive (not shown). The dipper drive is preferably an X-Y (two-dimensional) electrical servo-motor powered positioning drive. Alternatively, two linear electrical servo-motor powered drives can be coupled in a perpendicular configuration to allow the horizontal and vertical motion needed to traverse the channel 504. The dipper drive is advantageously enclosed within frame extension 505.

The dipper mechanism also preferably includes a dip head 509 which, as shown, is suspended from dipper arm 508. Dip head 509 advantageously includes a dip head connector 512 which is connected to the dipper arm 508. The dip head connector is also connected to a longitudinal top member 522. Longitudinal member 522 forms part of a dipping mechanism tray holder 514.

The dipping mechanism tray holder 514 also preferably has a basket which is open, perforated or otherwise foraminous in construction so as to allow liquid movement about the wafers 50 being processed. As shown the basket includes a series of circumferential rings 521. Rings 521 are connected by a top bar 522 which is suspended from connector 512. The lower portions of the rings are connected by lower longitudinal members 523 and a basket bottom piece 524 which is preferably perforated. The lower longitudinal members and bottom piece are preferably formed and spaced to provide a tray receptacle for receiving and holding wafer tray 60. The tray receptacle is similar in design to the construction employed in rotor 133, and the description will not be repeated. The trays are slid into and retrieved from the tray holder using the mechanical arm.

Dipper 507 is shown in FIG. 37 with the movable subassembly of the dipper in a fully downward or submerged position in solid lines. In this submerged position the wafers held in the wafer tray and tray holder are capable of full insertion into tanks 501 or 502 to provide full immersion or submersion in a bath of processing fluid (not shown). FIG. 37 also shows in phantom lines the dipper movable assembly positioned in an upward retracted position. Partial immersion positions exist between a fully upward retracted position and the downward submersion position shown for rear tank 502 in FIG. 37.

In operation, wafers held upon trays 60 are inserted into the dipper basket and the mechanical arm tray holder is then retracted. The dipper arm is then moved into the desired position to achieve immersion of at least part, or more preferably full submersion, of the wafers and tray into the desired processing bath contained in either tank 501 or 502. The dipper driver can be controlled to jog the wafers either horizontally or vertically and provide agitation of the wafers within the bath of processing fluid. The wafers are left in the desired immersion position until the desired processing has been accomplished. The wafers and associated tray are then moved by the dipper arm into an upward position wherein the processing chemical can drain back to the tank. Thereafter the movable dipper assembly is either held for removal of the wafers and trays, or moved into the second tank 501 or 502, as desired. The wafers are then processed in the second processing fluid until the desired processing has been completed. Thereafter the dipper arm is moved upwardly to withdraw the wafers from the processing bath and preferably left to drain briefly to conserve processing fluids. The wafer trays are then retrieved by the mechanical arm in a manner similar to that described above in connection with the retrieval of trays from rotor 133.

Operation and Methods

The operation and methodology of processor 40 has in part been explained above. Further description will now be given.

The invention further includes novel methods for processing semiconductor wafers and similar units requiring extremely low contamination. The methods can include providing a suitable processor, such as processor 40 described herein above and the associated subsystems thereof. Novel methods of processing such units preferably are performed by loading the wafers or other units to the system in carriers, such as wafer carriers 51. Such loading step is to a work space which is enclosed or substantially enclosed, such as working space 46. The loading step can include opening an enclosure door, such as door 59 of the interface port to allow entry of the wafers. The loading preferably is done by opening the enclosure door and extending a loading shelf through an open interface opening, such as port 56. Positioning of the loading shelf can be accomplished by moving the first carriage outwardly into an extended loading position.

The loading is further advantageously accomplished by depositing the wafers held within wafer carriers onto an extended loading shelf which is positioned through the interface opening. The wafers held in the carriers are positioned by depositing the loaded wafer carriers onto the extended shelf. The first carriage is thereafter moved such as by retracting the first carriage and the extended cantilevered shelf. After retracting the shelf through the interface port the methods advantageously include closing the interface port door or other similar enclosure door.

The methods also preferably include transferring wafers to a wafer tray, such as tray 60. Such transferring preferably is done by transferring the wafer from a wafer carrier and simultaneously onto the wafer tray. This is done by lifting the wafers from the wafer carrier using the wafer tray. The transferring is advantageously accomplished by extending the wafer tray through an opening in the wafer carrier, for example elevating the wafer tray up through a bottom opening in the wafer carrier to lift the wafers. The transferring preferably is accomplished using an array of wafer receivers, such as receivers 66. The wafer receivers which receive the wafers are preferably spaced and parallel to allow the receivers of the tray to be extended to receive the wafers in an edgewise relationship. The receiving is most preferably done using receiving channels having converging side surfaces which perform a guiding function as the tray and wafers approach relative to one another. The receiving also advantageously includes positioning edges of the received wafers into receiver bottom sections 68 which includes positioning the edges into slots having spaced approximately parallel receiving slots with surfaces along marginal edge portions which hold the wafers in a spaced substantially parallel array.

The transferring also preferably includes extending, such as by lifting, the wafers received upon the wafer trays so as to clear the wafer free of the wafer carriers. This clearing of the wafers installed upon the trays completes the transferring of the wafers to perform an installing of the wafers onto the wafer trays.

The transferring and installing operations can in the preferred embodiment be preceded by storing wafer trays in a wafer tray storage area or array. The wafer trays can be stored by slipping the wafer trays into storage receptacles, such as upon storage support ledges 109. The storing can occur by vertically arraying the unloaded wafer trays.

The wafer trays held within the storage receptacles are also preferably removed by unloading therefrom. This unloading can advantageously be done by elevating or otherwise by extending a tray support, such as head 129 into proximity to and then engaging the head with the tray. The extending can function by lifting the engaged head and then moving to dislocate the lifted tray from the storage area. This dislocating can most easily be accomplished by moving the storage area, such as by moving the second carriage 102, most preferably by retracting the carriage.

The steps preceding the transferring step can also advantageously include passing the engaged wafer tray through a pass-through opening in the first carriage. The passing-through step can be accomplished by lowering or retracting the engaged wafer trays through the pass-through opening and thus placing the wafer tray in a position suitable for performing the transferring. The passing-through most preferably includes aligning the engaged wafer tray with the pass-through opening.

The steps preceding the transferring and installing process also preferably include relatively moving the engaged wafer trays relative to the wafer carriers to bring the engaged wafer trays into aligned position. This aligning step is most ideally done by retracting or otherwise moving the first carriage rearwardly until the wafer carrier opening and engaged wafer tray are aligned for transfer and installation.

After the transferring or other installing of the wafers onto the wafer trays, the loaded wafer trays are preferably inventoried, such as by holding upon the second carriage. This storing is in the preferred embodiments done by extending or otherwise moving the second carriage or other loaded tray storage relative to the loaded wafer trays. The loaded wafer trays can be stored by positioning them over a holding features such as holding receptacles 125. The positioning can be followed by lowering the wafer trays into the holders and then supporting the wafer trays by the wafer holders.

The loaded wafer trays can then be processed further by loading the wafer tray onto a wafer conveyor, such as conveyor 140. The loading onto the conveyor can be done by moving a wafer tray engagement tool into engagement with the tray. This engaging step is most preferably done by sliding portions of the wafer engagement tool along receiving features of the wafer tray, such as by sliding the engagement edges 183 along receiving channels 83 of the tray, most preferably along opposing sides of the wafer tray. The engaging can further be perfected by lifting or otherwise interengaging the wafer tray engagement tool with the wafer tray being moved. This is most preferably done by lifting the tool relative to the tray and thereby positioning a longitudinal engagement feature, such as tines 184, against a complementary surface of the tray so that longitudinal or other lateral displacement of the tray upon the tool does not occur due to movement.

The methods also preferably include moving the wafer trays to one or more processing stations. The moving can be done by tramming the loaded wafer tray along a defined guide track upon a movable tram. The moving or conveying step can also include horizontally positioning the wafer tray, and vertically positioning the wafer tray, and orienting the angular orientation of the wafer tray to enable the wafer tray to be positioned into a processing chamber. This functioning is preferably followed by loading the wafer tray into the processing chamber. This loading can be done by inserting the loaded wafer tray into a centrifugal wafer tray rotor. The inserting or other loading step can best be accomplished by sliding the loaded wafer tray into an engaged relationship with the rotor by receiving interengaging parts of the rotor and wafer tray.

The wafers which were inserted or otherwise installed into the processing chamber are then preferably further treated by processing with fluid processing materials, such as chemical processing fluids, liquid or gas; or heating, cooling or drying fluids, most typically gases.

The processing can also advantageous be centrifugal processing which involves rotating or otherwise spinning the wafers being processed, particularly when still installed upon the wafer trays. The spinning preferably occurs with the wafers positioned within a rotor which performs a restraining function keeping the wafers in an aligned array centered near the axis of rotation. The centrifugal processing can include a variety of spinning, spraying, rinsing and drying phases as desired for the particular articles being processed. Additional preferred processing parameters are included in the appendix hereto.

The processing can also include immersion processing, such as can be performed by the immersion processing station 414 described above. Immersion station 414 or other suitable station can perform processes which include positioning a dipper so as to allow installation of a loaded wafer tray thereon. As shown, this is down by raising the dipper arm upwardly and positioning the wafer holding basket with an open side forwardly. The mechanical arm can then function by inserting or otherwise installing or loading the basket with an open receiver for accepting the loaded wafer tray. After insertion and loading of the wafer tray onto the dipper movable assembly, then the dipper arm is used by moving the held wafers on the trays so as to process the wafers in the desired immersion tank. This dipping or immersing operation is preferably a submersing step which places the entire tray of wafers into the bath of processing chemical. Thereafter the wafers are processed by holding the wafers in the desired immersion position and conduction any monitoring desired while performing the bath processing.

The immersion processing methods can further include withdrawing the bathed wafers, such as by lifting the dipping arm upwardly. The wafer holding head is then preferably removed from the bath and is held in a draining condition to allow processing liquids to drain back into the bath from whence they were removed. The immersion processing can then be repeated for the second or other subsequent processing bath. After the bathing processes have been finished at any particular station then the mechanical arm is used by unloading the wafer trays from the dippers and the loaded wafer trays are moved to the next desired processing station.

The methods of this invention also include unloading the wafer trays from the processing stations, such as by engaging the loaded wafer trays with a tray engagement tool in processes similar to those discussed above. The engaged and loaded wafer tray is then preferably processed by relocating the wafer tray to a second processing station, such as by conveying by moving with the mechanical arm assembly. The relocating can include withdrawing the wafer tray from the processing chamber and moving to another processing chamber and installing the wafer tray therein. The processing can then be furthered using a processing sequence similar to that described or in other processing steps desired.

The wafer trays are also handled by conveying the wafer trays and supported wafers to a holding station and holding the wafers thereat. The holding awaits an interface unloading sequence which can be accomplished by transferring the wafer trays and supported wafers from the wafer trays back to wafer carriers. The transferring or retransferring step back to the wafer carriers is essentially a reverse of the transferring and installing steps described above. Such advantageously includes unloading the wafer trays from the holding area, such as by lifting loaded wafer trays from the holding receptacles. The lifting or other removing of the wafer trays from the holders is advantageously done by extending an elevator head through an aligned wafer carrier and elevating the wafer trays. The holders are then moved in a relative fashion from the lifted or otherwise supported wafer trays. This is advantageously done by moving the second wafer carriage, such as by retracting the wafer carriage rearwardly away from the supported wafer trays. The relative moving of the removed loaded wafer trays and holders allows the wafer trays to be lowered or otherwise retracted. The retracting is best performed by lowering the wafer tray downward after aligning the wafer tray with a wafer carrier. The lowering causes a transferring of wafers from the wafer trays onto the wafer carrier.

The methods also preferably include retracting the elevators downwardly and beneath the first carriage with the supported and now unloaded wafer trays thereon. The first carriage can then be moved into the pass-through position by aligning the empty wafer tray with the pass-through opening. The empty trays can then be extended, such as upwardly, through the pass-through opening.

The methods then preferably include moving the transferred wafers held in the wafer carriers into an extended unloading position through the interface port. This is advantageously done by moving the first carriage forwardly and extending the cantilevered shelf out through the interface port.

The moving of the first carriage forwardly to accomplish unloading, can also be used to perform a storing function for the empty wafer trays into the empty wafer storage array. This is preferably done by elevating the wafer trays into an aligned storage position, such as at a desired aligned storage elevation and then moving the first carriage and attached storage gallery toward the engaged empty wafer tray. Once installed the empty wafer tray can be lowered into a storage position. The empty wafer trays are preferably stored in a downwardly progressing fashion when the elevator is used.

The wafer carriers and associated processed wafers are taken from the processor by removing the loaded wafer carrier from the cantilevered shelf after such has been extended out through the interface port or other unloading passageway. This is typically done by manually grasping the wafer carrier with the processed wafers therein.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processor for processing semiconductor articles, comprising:
   a frame;
   an enclosure connected to the frame for providing an enclosed work space;
   an interface port in said enclosure through which semiconductor articles are moved relative to said work space;
   a plurality of processing stations; said processing stations having access openings which open to the work space to allow installation and removal of semiconductor articles relative to said processing stations;
   at least one centrifugal processing station forming at least one of said plurality of processing stations;
   at least one immersion processing station forming at least one of said plurality of processing stations; said at least one immersion processing station including at least one immersion tank in which the semiconductor articles are immersed;
   a conveyor for conveying semiconductor articles to and from said plurality of processing stations.

2. A semiconductor processor according to claim 1 wherein said plurality of processing stations are constructed to process the semiconductor articles in batches.

3. A semiconductor processor according to claim 1 wherein said at least one immersion tank includes a plurality of immersion tanks.

4. A semiconductor processor according to claim 1 and further comprising a dipper mechanism for dipping batches of semiconductor articles into said at least one immersion tank.

5. A semiconductor processor according to claim 1 and further comprising a dipper mechanism for dipping batches of semiconductor articles into said at least one immersion tank, said dipper mechanism including a dip head for holding semiconductor articles thereon and a dipper drive which moves the dip head upwardly and downwardly relative to said at least one immersion tank.

6. A semiconductor processor according to claim 1 wherein said at least one immersion tank includes a plurality of immersion tanks, and further comprising a dipper mechanism for dipping batches of semiconductor articles into said plurality of immersion tanks.

7. A semiconductor processor according to claim 1 wherein said at least one immersion tank includes a plurality of immersion tanks, and further comprising a dipper mechanism for dipping batches of semiconductor articles into and between said plurality of immersion tanks.

8. A semiconductor processor according to claim 1 and further comprising a dip head, said dip head having a tray receptacle for receiving and holding a tray used to support said semiconductor articles.

9. A semiconductor processor according to claim 1 wherein said plurality of processing stations are constructed to process the semiconductor articles in batches.

10. A semiconductor processor for processing semiconductor articles, comprising:
    a frame;
    an enclosure connected to the frame for providing an enclosed work space;
    an interface port in said enclosure through which semiconductor articles are moved relative to said work space;
    a plurality of processing stations; said processing stations having access openings which open to the work space to allow installation and removal of semiconductor articles relative to said processing stations;
    a conveyor for conveying semiconductor articles to and from said plurality of processing stations;
    at least one immersion processing station forming at least one of said plurality of processing stations; said at least one immersion processing station including at least one immersion tank in which the semiconductor articles are immersed.

11. A semiconductor processor according to claim 10 wherein said at least one immersion tank includes a plurality of immersion tanks.

12. A semiconductor processor according to claim 10 and further comprising a dipper mechanism for dipping batches of semiconductor articles into said at least one immersion processing station.

13. A semiconductor processor according to claim 10 and further comprising a dipper mechanism for dipping batches of semiconductor articles into said at least one immersion processing station, said dipper mechanism including a dip head for holding semiconductor articles thereon and a dipper drive which moves the dip head upwardly and downwardly relative to said at least one immersion tank.

14. A semiconductor processor according to claim 10 wherein said at least one immersion tank includes a plurality of immersion tanks, and further comprising a dipper mechanism for dipping batches of semiconductor articles into said plurality of immersion tanks.

15. A semiconductor processor according to claim 10 and further comprising a dip head, said dip head having a tray receptacle for receiving and holding a tray used to support said semiconductor articles.

16. A method for processing a batch of semiconductor articles, comprising:

loading a batch of semiconductor articles held in a wafer carrier into an enclosed work space;

transferring the batch of semiconductor articles from said wafer carrier;

moving the transferred batch of semiconductor articles onto a conveyor for conveying the semiconductor articles to and from a plurality of processing stations which are accessed from the enclosed work space, said plurality of processing stations including at least one centrifugal processing station and at least one immersion processing station;

conveying the batch of semiconductor articles to said at least one centrifugal processing station;

processing the batch of semiconductor articles within said at least one centrifugal processing station;

conveying the batch of semiconductor articles to said at least one immersion processing station;

processing the batch of semiconductor articles within said at least one immersion processing station.

17. A method according to claim 16 wherein:

said conveying the batch of semiconductor articles to said at least one immersion processing station includes loading the batch onto a dipper mechanism;

said processing the batch of semiconductor articles within said at least one immersion processing station includes submersing the batch of semiconductor articles into a bath of processing liquid held in an immersion tank.

18. A method according to claim 16 wherein:

said conveying the batch of semiconductor articles to said at least one immersion processing station includes loading the batch onto a dipper mechanism which can move the batch upwardly and downwardly;

said processing the batch of semiconductor articles within said at least one immersion processing station includes submersing the batch of semiconductor articles into a bath of processing liquid held in an immersion tank.

19. A method according to claim 16 wherein:

said conveying the batch of semiconductor articles to said at least one immersion processing station includes loading the batch onto a dipper mechanism which can move the batch upwardly and downwardly;

said processing the batch of semiconductor articles within said at least one immersion processing station includes submersing the batch of semiconductor articles into plural baths of processing liquids held in plural immersion tanks.

20. A method according to claim 16 wherein said transferring includes placing the semiconductor articles upon a processing tray which holds the semiconductor articles.

* * * * *